US010979027B2

(12) United States Patent
Nosaka

(10) Patent No.: US 10,979,027 B2
(45) Date of Patent: Apr. 13, 2021

(54) ACOUSTIC WAVE DEVICE, RADIO FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 134 days.

(21) Appl. No.: 16/364,417

(22) Filed: Mar. 26, 2019

(65) Prior Publication Data
US 2019/0245517 A1 Aug. 8, 2019

Related U.S. Application Data

(63) Continuation of application No. PCT/JP2017/033743, filed on Sep. 19, 2017.

(30) Foreign Application Priority Data

Sep. 29, 2016 (JP) .............................. JP2016-192340

(51) Int. Cl.
H03H 9/64 (2006.01)
H03H 9/145 (2006.01)
H03H 9/25 (2006.01)
H03F 3/19 (2006.01)
H03H 9/72 (2006.01)

(52) U.S. Cl.
CPC ............. *H03H 9/6483* (2013.01); *H03F 3/19* (2013.01); *H03H 9/145* (2013.01);
(Continued)

(58) Field of Classification Search
CPC ...... H03H 9/145; H03H 9/14541; H03H 9/25; H03H 9/64; H03H 9/6403; H03H 9/6479;
(Continued)

(56) References Cited

U.S. PATENT DOCUMENTS 5,694,095 A * 12/1997 Mineyoshi ........... H03H 9/0542
310/313 R
9,246,536 B2 * 1/2016 Caron ..................... H04B 1/52
(Continued)

FOREIGN PATENT DOCUMENTS

JP  S47-016504 A    5/1972
JP  10-079641 A  *  3/1998
(Continued)

OTHER PUBLICATIONS

K. Baraka et al.; "Reconfiguration of Bulk Acoustic Wave Filters Using RF-MEMS Switches and CMOS Transistors"; Proceedings of the 8th IEEE International NEWCAS Conference; conference date Jun. 20-23, 2010, pp. 169-172 and 1 page IEEE Xplore abstract. (Year: 2010).*

(Continued)

*Primary Examiner* — Barbara Summons
(74) *Attorney, Agent, or Firm* — Pearne & Gordon LLP

(57) ABSTRACT

A variable filter includes a serial arm resonator and a parallel arm resonance circuit, the parallel arm resonance circuit includes a parallel arm resonator and a capacitance element connected to the parallel arm resonator, the serial arm resonator and the parallel arm resonator respectively include IDT electrodes each formed of a plurality of electrode fingers formed on a substrate, and a film thickness of the plurality of electrode fingers of the parallel arm resonator is larger than a film thickness of the plurality of electrode fingers of the serial arm resonator.

19 Claims, 18 Drawing Sheets

(52) U.S. Cl.
CPC .......... *H03H 9/14541* (2013.01); *H03H 9/25* (2013.01); *H03H 9/6403* (2013.01); *H03H 9/6479* (2013.01); *H03H 9/72* (2013.01); *H03F 2200/111* (2013.01); *H03F 2200/165* (2013.01); *H03F 2200/451* (2013.01); *H03H 2210/012* (2013.01)

(58) Field of Classification Search
CPC .. H03H 9/6483; H03H 9/72; H03H 2210/012; H04B 1/00; H04B 1/18; H04B 1/40; H03F 3/19; H03F 2200/111; H03F 2200/165; H03F 2200/451
USPC ................................ 333/133, 193, 195, 189
See application file for complete search history.

(56) References Cited

U.S. PATENT DOCUMENTS

| | | | |
|---|---|---|---|
| 10,630,257 B2 * | 4/2020 | Nosaka | H03H 9/542 |
| 10,715,107 B2 * | 7/2020 | Nosaka | H03H 9/145 |
| 10,727,810 B2 * | 7/2020 | Nosaka | H03H 9/72 |
| 2008/0129418 A1 | 6/2008 | Miura et al. | |
| 2009/0251235 A1 | 10/2009 | Belot et al. | |
| 2016/0294357 A1 | 10/2016 | Tani | |

FOREIGN PATENT DOCUMENTS

| | | | |
|---|---|---|---|
| JP | H10-335965 A | | 12/1998 |
| JP | 11-330904 A | * | 11/1999 |
| JP | 2002-232264 A | | 8/2002 |
| JP | 2002-299997 A | | 10/2002 |
| JP | 2004-023593 A | | 1/2004 |
| JP | 2008-109413 A | | 5/2008 |
| JP | 2013-081068 A | | 5/2013 |
| JP | 2015-012324 A | | 1/2015 |
| WO | 2015/087894 A1 | | 6/2015 |

OTHER PUBLICATIONS

International Search Report for PCT/JP2017/033743 dated Dec. 12, 2017.
Written Opinion for PCT/JP2017/033743 dated Dec. 12, 2017.

* cited by examiner

CAPACITANCE SELF-
RESONANCE POINT

ACOUSTIC WAVE DEVICE, RADIO FREQUENCY FRONT-END CIRCUIT, AND COMMUNICATION DEVICE

This is a continuation of International Application No. PCT/JP2017/033743 filed on Sep. 19, 2017 which claims priority from Japanese Patent Application No. 2016-192340 filed on Sep. 29, 2016. The contents of these applications are incorporated herein by reference in their entireties.

BACKGROUND

Technical Field

The present disclosure relates to an acoustic wave device having an acoustic wave resonator, a radio frequency front-end circuit, and a communication device.

An acoustic wave filter using an acoustic wave has been widely used as a band pass filter or the like arranged at a front end portion of an existing mobile communication apparatus. In addition, a radio frequency front-end circuit including a plurality of acoustic wave filters has been put into practical use in order to be compliant with composite system such as multi-mode/multi-band.

For example, as a multi-band capable acoustic wave filter, a configuration is known in which a set of a capacitor and a switch which are connected in parallel to each other is connected in series to a parallel arm resonance circuit (parallel arm resonator) of a ladder filter configured of a BAW resonator (see, for example, Patent Document 1). Such an acoustic wave filter configures a tunable filter capable of varying frequencies of a pass band and an attenuation band in response to conduction (on) and non-conduction (off) of the switch.

Patent Document 1: U.S. Patent Application Publication No. 2009/0251235

BRIEF SUMMARY

However, in a frequency variable type acoustic wave device, such as the tunable filter, disclosed in Patent Document 1, since an impedance of the parallel arm resonance circuit increases when the frequency is varied (when the switch is off) by the capacitor connected to the parallel arm resonator, attenuation characteristics deteriorate. On the other hand, in the frequency variable type acoustic wave device, in order to secure a frequency variable width, it is necessary to widen a resonance band width (anti-resonant frequency-resonant frequency) of the acoustic wave resonator. In addition, when an acoustic wave resonator having an interdigital transducer (IDT) electrode is used to form the wide resonance band width, in addition to a resonance point and an anti-resonance point which configure the pass band, a resonance of a higher-order mode is present on a higher-frequency side than the pass band. Therefore, there is a problem that the attenuation characteristics on the higher-frequency side than the pass band further deteriorate due to the resonance of the higher-order mode.

Accordingly, the present disclosure provides a frequency variable type acoustic wave device in which attenuation characteristics on a higher-frequency side than a pass band are improved, a radio frequency front-end circuit, and a communication device.

An acoustic wave device according to an aspect of the present disclosure is a frequency variable type acoustic wave device, the acoustic wave device includes: a first input and output terminal and a second input and output terminal for input and output of a radio frequency signal; a serial arm resonance circuit which is provided in a first path connecting the first input and output terminal and the second input and output terminal and is constituted of a first acoustic wave resonator; and a parallel arm resonance circuit which is provided in a second path connecting a node in the first path and ground and forms a pass band with the serial arm resonance circuit, in which the parallel arm resonance circuit includes a second acoustic wave resonator, and a frequency variable circuit connected to the second acoustic wave resonator and for varying the pass band, the frequency variable circuit includes a capacitance element connected to the second acoustic wave resonator, each of the first acoustic wave resonator and the second acoustic wave resonator includes an IDT electrode constituted of a plurality of electrode fingers formed on a substrate at least part of which has piezoelectricity, and a film thickness of the plurality of electrode fingers of the second acoustic wave resonator is larger than a film thickness of the plurality of electrode fingers of the first acoustic wave resonator.

According to the above configuration, the electrode finger film thickness of the second acoustic wave resonator configuring the parallel arm resonance circuit is larger than the electrode finger film thickness of the first acoustic wave resonator configuring the serial arm resonance circuit. Therefore, a frequency interval between a fundamental mode resonance point and a higher-order mode resonance point of the second acoustic wave resonator becomes larger than a frequency interval between a fundamental mode resonance point and a higher-order mode resonance point of the first acoustic wave resonator. With this, since a frequency of a higher-order mode anti-resonance point of the first acoustic wave resonator and a frequency of a higher-order mode resonance point of the second acoustic wave resonator can be brought close to each other, attenuation characteristics of a higher-order mode generation frequency band (an attenuation band on a higher-frequency side than the pass band) can be improved.

Furthermore, the capacitance element may be configured of a substrate and a comb-tooth capacitance electrode constituted of a plurality of electrode fingers formed on the substrate.

With this configuration, since the first acoustic wave resonator, the second acoustic wave resonator, and the capacitance element configuring the acoustic wave device can be formed on the same substrate, the acoustic wave device can be miniaturized. Additionally, by adjusting a pitch, the number of pairs, a cross-width, and the like of the electrode fingers which configure the comb-tooth capacitance electrode, it is possible to set a capacitance value in accordance with a frequency variable width.

Furthermore, a pitch of the plurality of electrode fingers configuring the comb-tooth capacitance electrode may be narrower than a pitch of the plurality of electrode fingers configuring each of the first acoustic wave resonator and the second acoustic wave resonator, a film thickness of the plurality of electrode fingers of the comb-tooth capacitance electrode may be equal to or smaller than the film thickness of the plurality of electrode fingers of the first acoustic wave resonator, and a self-resonance point of the capacitance element configured of the comb-tooth capacitance electrode and the substrate may be formed on a higher-band side than the pass band of the acoustic wave device.

Here, as the pitch of the electrode fingers becomes narrower, the self-resonance point shifts to the higher-band side. Here, the self-resonance point refers to a singular point at which a Q value (capacitance Q) of the capacitance element locally drops. Therefore, by making the pitch of the electrode fingers of the comb-tooth capacitance electrode narrower than the pitch of the electrode fingers of each of the first acoustic wave resonator and the second acoustic wave resonator and driving the self-resonance point of the capacitance element to the higher-band side than the pass band of the acoustic wave device, it is possible to increase a $Q$ value of the capacitance element in the pass band. In addition, when a frequency of the self-resonance point of the capacitance element is identical to a frequency of a resonance point or an anti-resonance point obtained by combined characteristics of the second acoustic wave resonator and the capacitance element, in the second acoustic wave resonator, a $Q$ value of the resonance point or the anti-resonance point drops due to the drop of the $Q$ value of the capacitance element. Therefore, by narrowing the pitch of the electrode fingers and driving the self-resonance point of the capacitance element to a higher-band side than a resonant frequency and an anti-resonant frequency of the second acoustic wave resonator, it is possible to suppress a $Q$ value of a circuit configured of the second acoustic wave resonator and the capacitance element from dropping and to secure a required $Q$ value. However, for reasons in manufacturing, the pitch of the electrode fingers is limited by the film thickness of the electrode fingers. Therefore, by making the film thickness of the electrode fingers of the capacitance element smaller than the film thickness of the electrode fingers of each of the first acoustic wave resonator and the second acoustic wave resonator, since the pitch of the electrode fingers of the capacitance element can be made narrower, it becomes easy to secure both the $Q$ value of the second acoustic wave resonator and the $Q$ value of the capacitance element. Thus, securing both of the $Q$ value of the second acoustic wave resonator and the $Q$ value of the capacitance element makes it possible to suppress loss in the pass band and to increase steepness of an attenuation slope.

Furthermore, an acoustic wave device according to an aspect of the present disclosure is a frequency variable type acoustic wave device, the acoustic wave device includes: a first input and output terminal and a second input and output terminal for input and output of a radio frequency signal; a serial arm resonance circuit which is provided in a first path connecting the first input and output terminal and the second input and output terminal and is constituted of a first acoustic wave resonator; and a parallel arm resonance circuit which is provided in a second path connecting a node in the first path and ground and forms a pass band with the serial arm resonance circuit, in which the parallel arm resonance circuit includes a second acoustic wave resonator, and a frequency variable circuit connected to the second acoustic wave resonator and for varying the pass band, the frequency variable circuit includes a capacitance element connected to the second acoustic wave resonator, each of the first acoustic wave resonator and the second acoustic wave resonator includes an IDT electrode constituted of a plurality of electrode fingers formed of a plurality of metal films laminated on a substrate at least part of which has piezoelectricity, and a film thickness of a metal film having the highest density among the plurality of metal films of the second acoustic wave resonator is larger than a film thickness of a metal film having the highest density among the plurality of metal films of the first acoustic wave resonator.

Acoustic wave propagation characteristics of the acoustic wave resonator are greatly affected by a weight of the IDT electrode formed on the substrate with piezoelectricity. According to the above configuration, the film thickness of the high-density metal film of the second acoustic wave resonator configuring the parallel arm resonance circuit is larger than the film thickness of the high-density metal film of the first acoustic wave resonator configuring the serial arm resonance circuit, which makes it possible to make an electrode finger weight of the second acoustic wave resonator larger than an electrode finger weight of the first acoustic wave resonator. Therefore, the frequency interval between the fundamental mode resonance point and the higher-order mode resonance point of the second acoustic wave resonator becomes larger than the frequency interval between the fundamental mode resonance point and the higher-order mode resonance point of the first acoustic wave resonator. With this, since the frequency of the higher-order mode anti-resonance point of the first acoustic wave resonator and the frequency of the higher-order mode resonance point of the second acoustic wave resonator can be brought close to each other, the attenuation characteristics of the higher-order mode generation frequency band (the attenuation band on the higher-frequency side than the pass band) can be improved.

Furthermore, a film thickness of a metal film other than the metal film having the highest density among the plurality of metal films of the second acoustic wave resonator may be equal to or smaller than a film thickness of a metal film other than the metal film having the highest density among the plurality of metal films of the first acoustic wave resonator.

As described above, by making the film thickness of the high-density metal film of the second acoustic wave resonator larger than the film thickness of the high-density metal film of the first acoustic wave resonator, the attenuation characteristics of the higher-order mode generation frequency band (the attenuation band on the higher-frequency side than the pass band) can be improved. On the other hand, the metal film having the highest density tends to have a higher resistivity than the metal film other than the metal film having the highest density. Additionally, by reducing resistance of the electrode fingers of the IDT electrode, the $Q$ value at the resonance point of the acoustic wave resonator is improved. From this viewpoint, the metal film other than the metal film having the highest density among the plurality of metal films of the first acoustic wave resonator which forms the pass band by the resonance point of the fundamental mode can be made thicker than the film thickness of the metal film other than the metal film having the highest density among the plurality of metal films of the second acoustic wave resonator. With this configuration, the $Q$ value at the resonance point of the first acoustic wave resonator can be improved, and an insertion loss in the pass band of the acoustic wave device can be reduced.

Furthermore, the capacitance element may be configured of a substrate and a comb-tooth capacitance electrode constituted of a plurality of electrode fingers formed of a plurality of metal films laminated on the substrate.

With this configuration, since the first acoustic wave resonator, the second acoustic wave resonator, and the capacitance element configuring the acoustic wave device can be formed on the same substrate and in the same lamination structure, the acoustic wave device can be miniaturized. Additionally, by adjusting the pitch, the number of pairs, the cross-width, and the like of the electrode fingers which configure the comb-tooth capacitance electrode, it is possible to set the capacitance value in accordance with the frequency variable width.

Furthermore, a pitch of the plurality of electrode fingers configuring the comb-tooth capacitance electrode may be narrower than a pitch of the plurality of electrode fingers configuring each of the first acoustic wave resonator and the second acoustic wave resonator, a film thickness of a metal film having the highest density among the plurality of metal films of the comb-tooth capacitance electrode may be equal to or smaller than the film thickness of the metal film having the highest density among the plurality of metal films of the first acoustic wave resonator, and a self-resonance point of the capacitance element configured of the comb-tooth capacitance electrode and the substrate may be formed on a higher-band side than the pass band of the acoustic wave device.

By making the electrode finger pitch of the high-density metal film of the comb-tooth capacitance electrode narrower than the electrode finger pitch of the high-density metal film of each of the first acoustic wave resonator and the second acoustic wave resonator and driving the self-resonance point of the capacitance element to the higher-band side than the pass band of the acoustic wave device, it is possible to increase the Q value of the capacitance element in the pass band. Additionally, by narrowing the electrode finger pitch of the high-density metal film of the comb-tooth capacitance electrode and driving the self-resonance point of the capacitance element to the higher-band side than the resonant frequency and the anti-resonant frequency of the second acoustic wave resonator, it is possible to suppress the Q value of the circuit configured of the second acoustic wave resonator and the capacitance element from dropping and to secure the required Q value. However, for reasons in manufacturing, the pitch of the electrode fingers is limited by the film thickness of the electrode fingers. Therefore, by making the film thickness of the high-density metal film of the capacitance element smaller than the film thickness of the high-density metal film of each of the first acoustic wave resonator and the second acoustic wave resonator, since the pitch of the electrode fingers of the capacitance element can be made narrower, it becomes easy to secure both the Q value of the second acoustic wave resonator and the Q value of the capacitance element. Thus, securing both of the Q value of the second acoustic wave resonator and the Q value of the capacitance element makes it possible to suppress the loss in the pass band and to increase the steepness of the attenuation slope.

Furthermore, a film thickness of a metal film other than the metal film having the highest density among the plurality of metal films of the comb-tooth capacitance electrode may be equal to or smaller than the film thickness of the metal film other than the metal film having the highest density among the plurality of metal films of the second acoustic wave resonator.

The capacitance element is an element for varying the resonant frequency configuring an attenuation pole where an impedance of the second acoustic wave resonator is minimized and does not affect the insertion loss of the pass band, so that a high capacitance Q value is not required. From this viewpoint, by setting a film thickness of a low-density metal film of each of the first acoustic wave resonator and the second acoustic wave resonator to be equal to or larger than a film thickness of a low-density metal film of the comb-tooth capacitance electrode, it is possible to improve the Q value of the acoustic wave resonator.

Furthermore, a higher-order mode resonant frequency of the second acoustic wave resonator may be higher than a higher-order mode resonant frequency of the first acoustic wave resonator.

With this, since the frequency of the higher-order mode anti-resonance point of the first acoustic wave resonator and the frequency of the higher-order mode resonance point of the second acoustic wave resonator can be brought close to each other, the attenuation characteristics of the higher-order mode generation frequency band (the attenuation band on the higher-frequency side than the pass band) can be improved.

Furthermore, the frequency variable circuit may further include a switch element connected in parallel to the capacitance element between the second acoustic wave resonator and the ground.

With this configuration, since the attenuation pole of the pass band on a low-band side can be subjected to a frequency shift in accordance with the on and off state of the switch element, a tunable filter for switching the pass band can be obtained.

Furthermore, the parallel arm resonance circuit may further include a third acoustic wave resonator, the third acoustic wave resonator may be connected in parallel to a circuit in which the second acoustic wave resonator and the frequency variable circuit are connected in series to each other between the node and the ground, and a resonant frequency of the third acoustic wave resonator may be different from a resonant frequency of the second acoustic wave resonator and an anti-resonant frequency of the third acoustic wave resonator may be different from an anti-resonant frequency of the second acoustic wave resonator.

With this configuration, the tunable filter capable of performing the frequency shift for at least one of the attenuation pole of the pass band on the low-band side and the attenuation pole of the pass band on the high-band side can be obtained.

Furthermore, the resonant frequency of the third acoustic wave resonator may be lower than the resonant frequency of the second acoustic wave resonator, the anti-resonant frequency of the third acoustic wave resonator may be lower than the anti-resonant frequency of the second acoustic wave resonator, and the frequency variable circuit may be connected in series only to the second acoustic wave resonator of the second acoustic wave resonator and the third acoustic wave resonator.

With this configuration, while shifting the attenuation pole of the pass band on the high-band side to the higher-band side, without necessarily dropping a shoulder of the pass band on the low-band side, the pass band can be shifted to the higher-band side.

Furthermore, the resonant frequency of the third acoustic wave resonator may be higher than the resonant frequency of the second acoustic wave resonator, the anti-resonant frequency of the third acoustic wave resonator may be higher than the anti-resonant frequency of the second acoustic wave resonator, and the frequency variable circuit may be connected in series only to the second acoustic wave resonator of the second acoustic wave resonator and the third acoustic wave resonator.

With this configuration, the tunable filter capable of shifting the pass band to the higher-band side, while shifting the attenuation pole of the pass band on the low-band side to the higher-band side, without necessarily dropping the shoulder of the pass band on the low-band side, can be obtained.

Furthermore, the parallel arm resonance circuit may further include a third acoustic wave resonator, the frequency variable circuit may be connected in series to a circuit in which the second acoustic wave resonator and the third acoustic wave resonator are connected in parallel to each other.

With this configuration, the tunable filter capable of shifting both the attenuation poles of the pass band on both sides to the higher-band side can be obtained.

Furthermore, the frequency variable circuit may be connected in series only to one of the second acoustic wave resonator and the third acoustic wave resonator, and the parallel arm resonance circuit may further include another frequency variable circuit connected in series only to another of the second acoustic wave resonator and the third acoustic wave resonator between the node and the ground.

With this configuration, while shifting the attenuation poles of the pass band on the high-band side and of the pass band on the low-band side to the higher-band side, without necessarily dropping the shoulders of the pass band on the high-band side and of the pass band on the low-band side, the pass band can be shifted to the higher-band side. As a result, for example, the tunable filter capable of shifting a center frequency while maintaining a band width can be obtained.

Furthermore, the frequency variable circuit may further include an inductor connected in series to the switch element, and a circuit in which the switch element and the inductor are connected in series to each other may be connected in parallel to the capacitance element.

With this configuration, the tunable filter having a wide frequency variable width of the pass band can be obtained.

Furthermore, a radio frequency front-end circuit according to an aspect of the present disclosure includes the acoustic wave device described above, and an amplifier circuit connected to the acoustic wave device.

With this configuration, the radio frequency front-end circuit including the frequency variable type acoustic wave device in which the attenuation characteristics on the higher-frequency side than the pass band are improved can be provided.

Furthermore, a communication device according to an aspect of the present disclosure includes an RF signal processing circuit that processes a radio frequency signal transmitted and received by an antenna element, and the radio frequency front-end circuit described above that transmits the radio frequency signal between the antenna element and the RF signal processing circuit.

With this configuration, the communication device including the frequency variable type acoustic wave device in which the attenuation characteristics on the higher-frequency side than the pass band are improved can be provided.

According to the present disclosure, a frequency variable type acoustic wave device in which attenuation characteristics on a higher-frequency side than a pass band are improved, a radio frequency front-end circuit, and a communication device can be provided.

BRIEF DESCRIPTION OF THE SEVERAL VIEWS OF THE DRAWINGS

FIG. 8A is a graph showing a bandpass characteristic of the variable filter according to the first embodiment (working example) when being switched on.

FIG. 9A is a graph showing a bandpass characteristic of a variable filter according to a comparative example when being switched on.

FIG. 10A is a graph showing a comparison of the bandpass characteristics of the variable filters according to the working example and the comparative example when being switched on.

DETAILED DESCRIPTION

Figure 1:
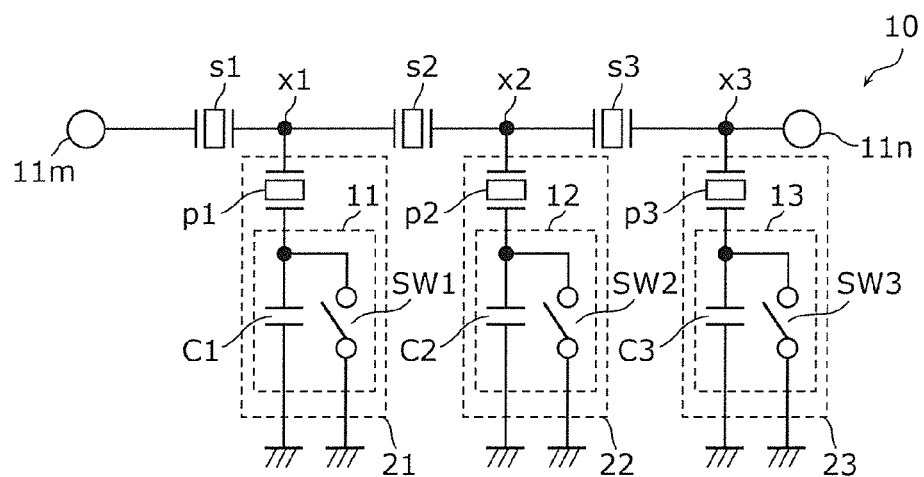
FIG. 1 is a circuit configuration diagram of a variable filter according to a first embodiment.

Hereinafter, embodiments of the present disclosure will be described in detail with reference to working examples and the drawings. Note that all embodiments described below indicate comprehensive or specific examples. Numerical values, shapes, materials, constituent elements, arrangement and connection forms of the constituent elements, and the like, which will be described in the following embodiments, are examples, and are not intended to limit the present disclosure. Constituent elements which are not described in independent claims among the constituent elements in the following embodiments are described as arbitrary constituent elements. In addition, sizes or size ratios of the constituent elements illustrated in the drawings are not necessarily strict. In addition, in the drawings, configurations that are substantially identical are given identical reference numerals, redundant descriptions thereof will be omitted or simplified.

First Embodiment

[1.1 Circuit Configuration of Variable Filter 10]

FIG. 1 is a circuit configuration diagram of a variable filter 10 according to a first embodiment. The variable filter 10 is, for example, a radio frequency filter circuit arranged at a front end portion of a multi-mode/multi-band capable cellular phone. The variable filter 10 is provided in a front-end circuit of a cellular phone or the like compliant with LTE (Long Term Evolution), for example, allows a radio frequency signal of Band (frequency band) standardized by 3GPP (Third Generation Partnership Project) to pass therethrough, and filters (attenuates) an unnecessary radio frequency signal which affects communication. This variable filter 10 is an acoustic wave device having a function of varying frequencies of a pass band and an attenuation band using an acoustic wave resonator.

As illustrated in the diagram, the variable filter 10 includes serial arm resonators s1, s2, and s3, parallel arm resonators p1, p2, and p3, and frequency variable circuits 11, 12, and 13.

Each of the serial arm resonators s1, s2, and s3 is a first acoustic wave resonator connected between an input and output terminal 11m (first input and output terminal) and an input and output terminal 11n (second input and output terminal). Additionally, each of the serial arm resonators s1, s2, and s3 configures a serial arm resonance circuit provided in a first path connecting the input and output terminal 11m and the input and output terminal 11n. Note that the serial arm resonance circuits are not limited to be configured only of the serial arm resonators s1, s2, and s3, respectively, may each be configured of one or more acoustic wave resonators. In the present embodiment, each of the serial arm resonance circuits is configured of one acoustic wave resonator but may be configured of a plurality of acoustic wave resonators. The serial arm resonance circuit configured of the plurality of acoustic wave resonators includes, for example, a longitudinally coupled resonator formed of a plurality of acoustic wave resonators, or a plurality of divided resonators obtained by one acoustic wave resonator being subjected to serial division or the like. For example, by using the plurality of divided resonators obtained by one acoustic wave resonator being subjected to the serial division or the like as the serial arm resonance circuit, adaptation to a filter characteristic in which electric power handling capability enhancement is required can be achieved, and by using the longitudinally coupled resonator as the serial arm resonance circuit, adaptation to a filter characteristic in which attenuation enhancement or the like is required can be achieved.

The parallel arm resonator p1 is a second acoustic wave resonator connected between a node x1 in the first path and ground (reference terminal). The parallel arm resonator p2 is the second acoustic wave resonator connected between a node x2 in the first path and the ground (reference terminal). The parallel arm resonator p3 is the second acoustic wave resonator connected between a node x3 in the first path and the ground (reference terminal). Note that the node x1 is a connection node between the serial arm resonators s1 and s2, the node x2 is a connection node between the serial arm resonators s2 and s3, and the node x3 is a connection node between the serial arm resonator s3 and the input and output terminal 11n.

This parallel arm resonators p1, p2, and p3 each have a resonant frequency on a lower-band side than the pass band of the variable filter 10 and each have an anti-resonant frequency in the pass band, the serial arm resonators s1, s2, and s3 each have a resonant frequency in the pass band and each have an anti-resonant frequency on a higher-band side than the pass band. Accordingly, in the present embodiment, the resonant frequencies of the parallel arm resonators p1, p2, and p3 are lower than the resonant frequencies of the serial arm resonators s1, s2, and s3, and the anti-resonant frequencies of the parallel arm resonators p1, p2, and p3 are lower than the anti-resonant frequencies of the serial arm resonators s1, s2, and s3.

Here, a resonant frequency of a resonator is a frequency of a "resonance point" which is a singular point at which an impedance of the resonator becomes minimum (ideally, a point at which the impedance becomes 0). Additionally, an anti-resonant frequency of the resonator is a frequency of an "anti-resonance point" which is a singular point at which the impedance of the resonator becomes maximum (ideally, a point at which the impedance becomes infinity). Note that in the following descriptions, for the sake of convenience, not only for a circuit configured of the resonator alone but also for a circuit configured of a plurality of resonators or impedance elements, the singular point at which the impedance becomes minimum (ideally, a point at which the impedance becomes 0) is referred to as the "resonance point", and a frequency thereof is referred to as a "resonant frequency". Additionally, the singular point at which the impedance becomes maximum (ideally, a point at which the impedance becomes infinity) is referred to as the "anti-resonance point", and a frequency thereof is referred to as a "anti-resonant frequency".

In addition, in the present embodiment, the parallel arm resonators p1, p2, and p3 are each configured of one acoustic wave resonator. However, the parallel arm resonators p1, p2, and p3 may each be configured of a plurality of divided resonators obtained by one acoustic wave resonator being subjected to serial division or the like.

With the above configuration, the serial arm resonators s1, s2, and s3 and the parallel arm resonators p1, p2, and p3 form the pass band of the variable filter 10.

The frequency variable circuit 11 includes a capacitance element C1 connected to the parallel arm resonator p1 and a switch SW1 and varies the pass band and the attenuation band on the lower-band side than the pass band of the variable filter 10. The parallel arm resonator p1 and the frequency variable circuit 11 configure a parallel arm resonance circuit 21 which is provided in a second path connecting the node x1 and the ground. The frequency variable circuit 12 includes a capacitance element C2 connected to the parallel arm resonator p2 and a switch SW2 and varies the pass band and the attenuation band on the lower-band side than the pass band of the variable filter 10. The parallel arm resonator p2 and the frequency variable circuit 12 configure a parallel arm resonance circuit 22 which is provided in the second path. The frequency variable circuit 13 includes a capacitance element C3 connected to the parallel arm resonator p3 and a switch SW3 and varies the pass band and the attenuation band on the lower-band side than the pass band of the variable filter 10. The parallel arm resonator p3 and the frequency variable circuit 13 configure a parallel arm resonance circuit 23 which is provided in the second path. In the present embodiment, the parallel arm resonator p1 is connected to the node x1, the parallel arm resonator p2 is connected to the node x2, the parallel arm resonator p3 is connected to the node x3, and the frequency variable circuits 11, 12, and 13 are each connected to the ground, but respective connection orders of the parallel arm resonators p1, p2, and p3 and the frequency variable circuits 11, 12, and 13 are not limited thereto, and may be reversed from the above-described connection orders.

The capacitance element C1 is connected between the node x1 and the ground (reference terminal). The capacitance element C2 is connected between the node X2 and the ground (reference terminal). The capacitance element C3 is connected between the node X3 and the ground (reference terminal). More specifically, the parallel arm resonator p1 and the capacitance element C1 are connected in series to each other and connected between the node x1 and the ground, the parallel arm resonator p2 and the capacitance element C2 are connected in series to each other and connected between the node x2 and the ground, and the parallel arm resonator p3 and the capacitance element C3 are connected in series to each other and connected between the node x3 and the ground. In other words, the parallel arm resonator p1 is connected to the node x1, the parallel arm resonator p2 is connected to the node x2, the parallel arm resonator p3 is connected to the node x3, and the capacitance elements C1, C2, and C3 are each connected to the ground.

The switch SW1 is connected in parallel to the capacitance element C1 and is a switch element in which one terminal is connected to a connection node between the parallel arm resonator p1 and the capacitance element C1 and the other terminal is connected to the ground. The switch SW2 is connected in parallel to the capacitance element C2 and is a switch element in which one terminal is connected to a connection node between the parallel arm resonator p2 and the capacitance element C2 and the other terminal is connected to the ground. The switch SW3 is connected in parallel to the capacitance element C3 and is a switch element in which one terminal is connected to a connection node between the parallel arm resonator p3 and the capacitance element C3 and the other terminal is connected to the ground. With the connection configuration described above, the switches SW1 to SW3 are turned on (conduction) or off (non-conduction) in accordance with a control signal from a control unit such as an RF signal processing circuit (RFIC: Radio Frequency Integrated Circuit) or the like, for example. The frequency variable circuits 11, 12, and 13 vary resonant frequencies of the parallel arm resonance circuits 21, 22, and 23 by on/off operations of the switches SW1 to SW3, respectively.

For example, in order to achieve miniaturization, the switches SW1 to SW3 are each configured of an FET (Field Effect Transistor) switch made of GaAs or CMOS (Complementary Metal Oxide Semiconductor) or a diode switch.

In the present embodiment, the frequency variable circuits 11, 12, and 13 are connected in series to the second acoustic wave resonators (in the present embodiment, the parallel arm resonators p1, p2, and p3), respectively, on the second path. By providing the frequency variable circuits 11 to 13 as described above, the variable filter 10 can provide a tunable (frequency variable type) filter which can switch the pass band and the attenuation band on the lower-band side than the pass band according to on or off states of the switches SW1 to SW3.

In other words, the variable filter 10 has a sixth order ladder filter structure in which a unit circuit configured of the serial arm resonator s1 (serial arm resonance circuit) and the parallel arm resonance circuit 21, a unit circuit configured of the serial arm resonator s2 (serial arm resonance circuit) and the parallel arm resonance circuit 22, and a unit circuit configured of the serial arm resonator s3 (serial arm resonance circuit) and the parallel arm resonance circuit 23 are in cascading connection.

According to the above-described configuration, in the variable filter 10, when the switches SW1 to SW3 are off, the attenuation pole of the pass band on the low-band side shifts to the higher-frequency side than that when the switches are on. Thus, the variable filter 10 configures a frequency variable type filter in which the low-band end of the pass band is variable.

In the variable filter 10 according to the present embodiment, each of the serial arm resonators s1, s2, and s3 and the parallel arm resonators p1, p2, and p3 has an IDT electrode formed of a plurality of electrode fingers formed on a substrate at least part of which has piezoelectricity. Note that the substrate having the piezoelectricity is a substrate having the piezoelectricity at least on a surface thereof. For example, the substrate may include a piezoelectric thin film on the surface thereof and may be configured of a multilayer body of a film having a different acoustic velocity from that of the piezoelectric thin film, a support substrate, and the like. Furthermore, the substrate may be, for example, a multilayer body including a high acoustic velocity support substrate and a piezoelectric thin film formed on the high acoustic velocity support substrate, a multilayer body including a high acoustic velocity support substrate, a low acoustic velocity film formed on the high acoustic velocity support substrate, and a piezoelectric thin film formed on the low acoustic velocity film, or a multilayer body including a support substrate, a high acoustic velocity film formed on the support substrate, a low acoustic velocity film formed on the high acoustic velocity film, and a piezoelectric thin film formed on the low acoustic velocity film. Note that the substrate may have the piezoelectricity on the entire substrate.

Here, the film thickness of the plurality of electrode fingers of each of the parallel arm resonators p1, p2, and p3 is larger than the film thickness of the plurality of electrode fingers of each of the serial arm resonators s1, s2, and s3. With this, a frequency interval between a fundamental mode resonance point and a higher-order mode resonance point of each of the parallel arm resonators p1, p2, and p3 becomes larger than a frequency interval between a fundamental mode resonance point and a higher-order mode resonance point of each of the serial arm resonators s1, s2, and s3. With this, since a frequency of a higher-order mode anti-resonance point of each of the serial arm resonators s1, s2, and s3 and a frequency of the higher-order mode resonance point of each of the parallel arm resonators p1, p2, and p3 can be brought close to each other, attenuation characteristics of a higher-order mode generation frequency band (the attenuation band on the higher-frequency side than the pass band) can be improved.

Note that the variable filter 10 according to the present embodiment is a sixth order ladder filter circuit in which the unit circuits each configured of one serial arm resonator and one parallel arm resonator are in cascading connection of three stages. However, it is sufficient for the variable filter (acoustic wave device) according to the present disclosure to have at least one stage of the above-described unit circuit.

Figure 2A:
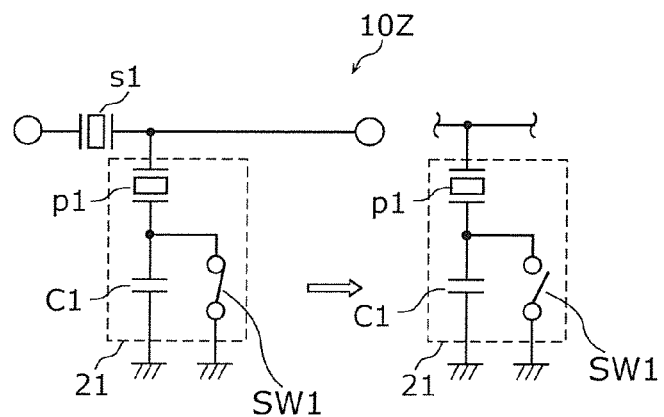
FIG. 2A is a unit circuit diagram illustrating an on/off operation of a switch of the variable filter.

FIG. 2A is a unit circuit diagram illustrating an on/off operation of a switch of a variable filter 10Z according to a modification of the first embodiment. As illustrated in the diagram, the variable filter 10Z includes the serial arm resonator s1, the parallel arm resonator p1, the capacitance element C1, and the switch SW1. The capacitance element C1 and the switch SW1 configure the frequency variable circuit and configure the parallel arm resonance circuit together with the parallel arm resonator p1. Here, the film thickness of the plurality of electrode fingers of the parallel arm resonator p1 is larger than the film thickness of the plurality of electrode fingers of the serial arm resonator s1. With this, the frequency interval between the fundamental mode resonance point and the higher-order mode resonance point of the parallel arm resonator p1 becomes larger than the frequency interval between the fundamental mode resonance point and the higher-order mode resonance point of the serial arm resonator s1. With this, since the frequency of the higher-order mode anti-resonance point of the serial arm resonator s1 and the frequency of the higher-order mode resonance point of the parallel arm resonator p1 can be brought close to each other, the attenuation characteristics of the higher-order mode generation frequency band (the attenuation band on the higher-frequency side than the pass band) can be improved.

Note that depending on the number of connection stages of the unit circuits, an insertion loss in the pass band, steepness of the pass band, and attenuation of the attenuation band change. For example, as the number of connection stages of the unit circuits increases, the insertion loss in the pass band increases, but the steepness of the pass band and the attenuation of the attenuation band can be secured. In other words, the number of connection stages of the unit circuits in the variable filter (acoustic wave device) according to the present disclosure may be appropriately set based on a required specification of the filter characteristic.

[1.2 Variable Filter Attenuation Characteristics]

Here, a problematic point in the attenuation characteristics of the variable filter will be described.

Figure 2B:
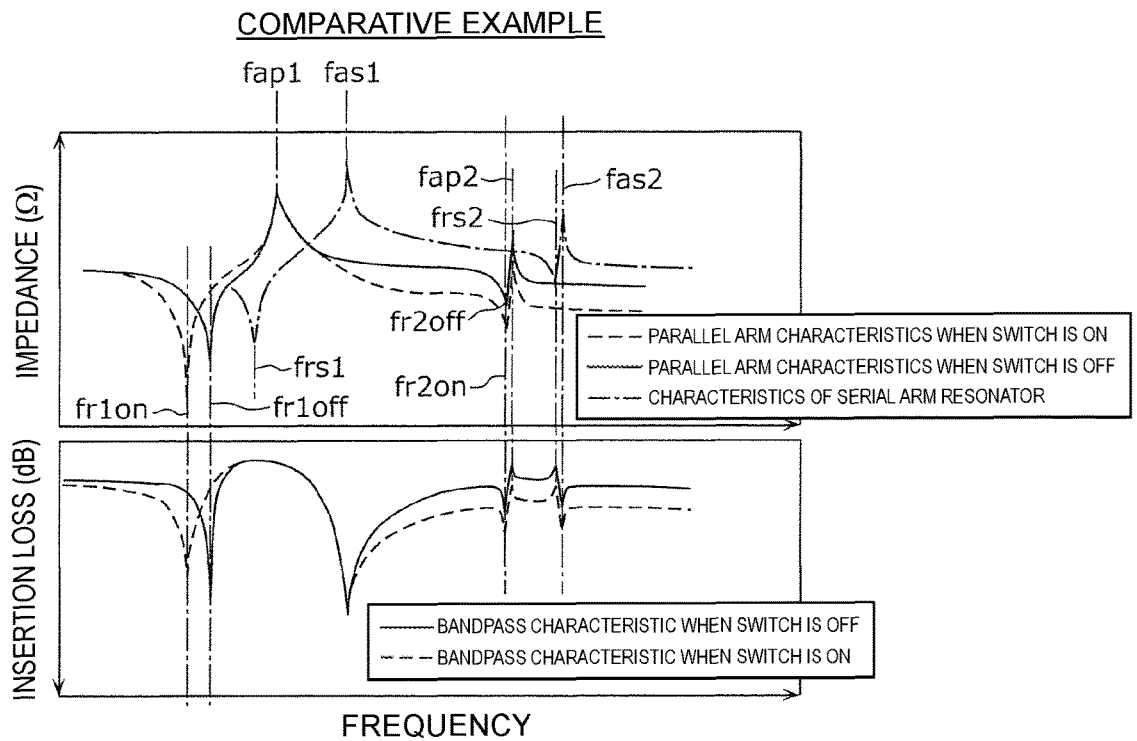
FIG. 2B includes graphs showing attenuation characteristics of an existing variable filter.

FIG. 2B includes graphs showing attenuation characteristics of a variable filter of a comparative example. Note that the variable filter according to the comparative example has the same circuit configuration as that of the variable filter 10Z illustrated in FIG. 2A, and the electrode finger film thicknesses of the parallel arm resonator p1 and the serial arm resonator s1 are equal to each other.

According to resonance characteristics in an upper portion of FIG. 2B, the parallel arm resonator p1 has a resonant frequency of the fundamental mode on the lower-band side than the pass band of the variable filter and has an anti-resonant frequency of the fundamental mode in the pass band. Additionally, the resonant frequency of the parallel arm resonator p1 is lower than the resonant frequency of the serial arm resonator s1, and the anti-resonant frequency of the parallel arm resonator p1 is lower than the anti-resonant frequency of the serial arm resonator s1.

In the variable filter according to the comparative example, when the switch SW1 is in the on state, impedance characteristics of the parallel arm resonance circuit 21 are characteristics which are not affected by the capacitance element C1. In other words, in this state, impedance characteristics of the parallel arm resonator p1 alone become the impedance characteristics of the parallel arm resonance circuit 21. On the other hand, when the switch SW1 is in the off state, the impedance characteristics of the parallel arm resonance circuit 21 are characteristics which are affected by the capacitance element C1. In other words, in this state, combined characteristics of the parallel arm resonator p1 and the capacitance element C1 become the impedance characteristics of the parallel arm resonance circuit 21.

As shown in FIG. 2B, the parallel arm resonance circuit 21 has two resonant frequencies fr1on and fr1off and one anti-resonant frequency fap1 (at this time, fr1on<fr1off is satisfied). Here, the reason why fr1on<fr1off is satisfied is due to influence of the impedance by the capacitance element C1 in the frequency band in the vicinity of the resonant frequency of the parallel arm resonator p1, by the switch SW1 being switched from on to off. Note that the anti-resonant frequency fap1 is identical to the anti-resonant frequency of the parallel arm resonator p1 alone, both when in the on state and when in the off state of the switch SW1.

As described above, in the variable filter according to the comparative example, when the switch SW1 is switched from on to off, in the parallel arm resonance circuit 21, the anti-resonant frequency is not shifted, and only the resonant frequency is shifted to the higher-band side (fr1on→fr1off).

Furthermore, in the variable filter, although it is necessary to widen a resonance band width (anti-resonant frequency-resonant frequency) of the acoustic wave resonator in order to secure a frequency variable width, in the parallel arm resonance circuit and the serial arm resonator having the acoustic wave resonator as described above, in addition to the resonant frequency and the anti-resonant frequency configuring the pass band, a resonance of the higher-order mode is present on the higher-frequency side than the pass band. As shown in FIG. 2B, on the higher-frequency side than the resonant frequencies and the anti-resonant frequencies of the fundamental mode, a resonant frequency (frs2) and an anti-resonant frequency (fas2) of the higher-order mode of the serial arm resonator s1, and resonant frequencies (fr2on and fr2off) and an anti-resonant frequency (fap2) of the higher-order mode of the parallel arm resonance circuit 21 are generated.

Due to the above-described resonance characteristics, the bandpass characteristic of the variable filter according to the comparative example becomes a characteristic as shown in a lower portion of FIG. 2B by the switching operation of the switch SW1. In the vicinity of the pass band, by turning the switch SW1 into the off state, only the attenuation pole of the pass band on the low-band side shifts to the higher-band side, and the pass band is varied.

Here, in the variable filter according to the comparative example, the frequency interval between the fundamental mode resonance point and the higher-order mode resonance point of the parallel arm resonance circuit 21 is substantially the same as the frequency interval between the fundamental mode resonance point and the higher-order mode resonance point of the serial arm resonator s1. Therefore, as shown in the lower portion of FIG. 2B, in the attenuation band on the higher-frequency side than the pass band, characteristics similar to the filter characteristics of the pass band obtained by the resonance characteristics of the fundamental mode are generated, and the attenuation characteristics deteriorate. In particular, by turning the switch SW1 into the off state, the impedance of the parallel arm resonance circuit 21 to which the capacitance element C1 is added increases, and therefore the attenuation in the vicinity of the higher-order mode generation frequency decreases (the insertion loss decreases).

As described above, in the variable filter using the capacitance element C1 as a frequency variable means, there is a problem that the attenuation characteristics on the higher-frequency side than the pass band further deteriorate due to the generation of the higher-order mode resonance.

In response to the above problem, the variable filter 10Z according to the present embodiment is characterized in that the electrode finger film thickness of the parallel arm resonator p1 configuring the parallel arm resonance circuit 21 is larger than the electrode finger film thickness of the serial arm resonator s1.

Figure 2C:
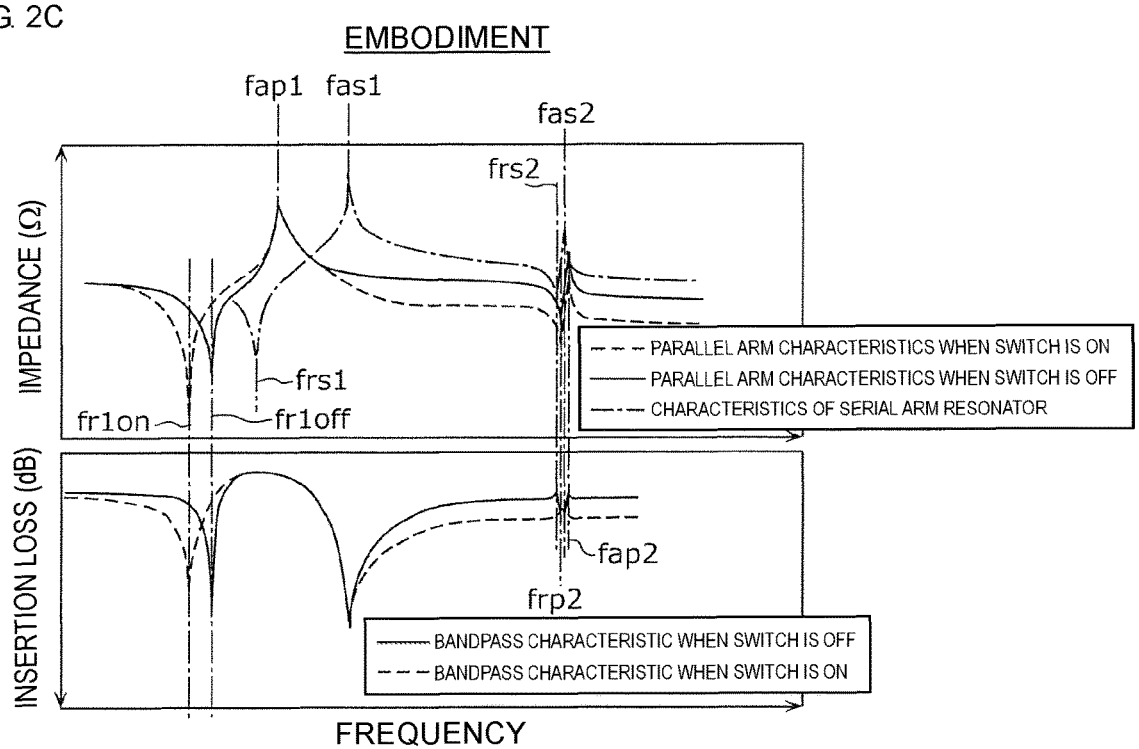
FIG. 2C includes graphs showing attenuation characteristics of the variable filter according to the embodiment.

FIG. 2C includes graphs showing the attenuation characteristics of the variable filter 10Z according to the embodiment. As shown in an upper portion of FIG. 2C, the parallel arm resonator p1 has a resonant frequency of the fundamental mode on the lower-band side than the pass band of the variable filter 10Z and has an anti-resonant frequency of the fundamental mode in the pass band. Additionally, the resonant frequency of the parallel arm resonator p1 is lower than the resonant frequency of the serial arm resonator s1, and the anti-resonant frequency of the parallel arm resonator p1 is lower than the anti-resonant frequency of the serial arm resonator s1. The parallel arm resonance circuit 21 has two resonant frequencies fr1on and fr1off and one anti-resonant frequency fap1 (at this time, fr1on<fr1off is satisfied). In the variable filter 10Z according to the embodiment as well, when the switch SW1 is switched from on to off, in the parallel arm resonance circuit 21, the anti-resonant frequency is not shifted, and only the resonant frequency is shifted to the higher-band side (fr1on→fr1off).

Due to the above-described resonance characteristics, the bandpass characteristic of the variable filter 10Z according to the embodiment becomes a characteristic as shown in a lower portion of FIG. 2C by the switching operation of the switch SW1. In the vicinity of the pass band, by turning the switch SW1 into the off state, only the attenuation pole of the pass band on the low-band side shifts to the higher-band side, and the pass band is varied.

Furthermore, in the variable filter 10Z, a resonance of the higher-order mode is present on the higher-frequency side than the pass band. As shown in FIG. 2C, on the higher-frequency side than the resonant frequencies and the anti-resonant frequencies of the fundamental mode, the resonant frequency (frs2) and the anti-resonant frequency (fas2) of the higher-order mode of the serial arm resonator s1, and a resonant frequency (frp2 (including fr2on and fr2off)) and the anti-resonant frequency (fap2) of the higher-order mode of the parallel arm resonance circuit 21 are generated.

Here, in the variable filter 10Z according to the embodiment, the frequency interval between the fundamental mode resonance point and the higher-order mode resonance point of the parallel arm resonance circuit 21 becomes larger than the frequency interval between the fundamental mode resonance point and the higher-order mode resonance point of the serial arm resonator s1. With this, since the higher-order mode anti-resonant frequency of the serial arm resonator s1 and the higher-order mode resonant frequency of the parallel arm resonance circuit 21 can be brought close to each other, the attenuation characteristics of the higher-order mode generation frequency band (the attenuation band on the higher-frequency side than the pass band) can be improved (the insertion loss can be increased).

[1.3 Electrode Configuration of Variable Filter 10]

Figure 3:
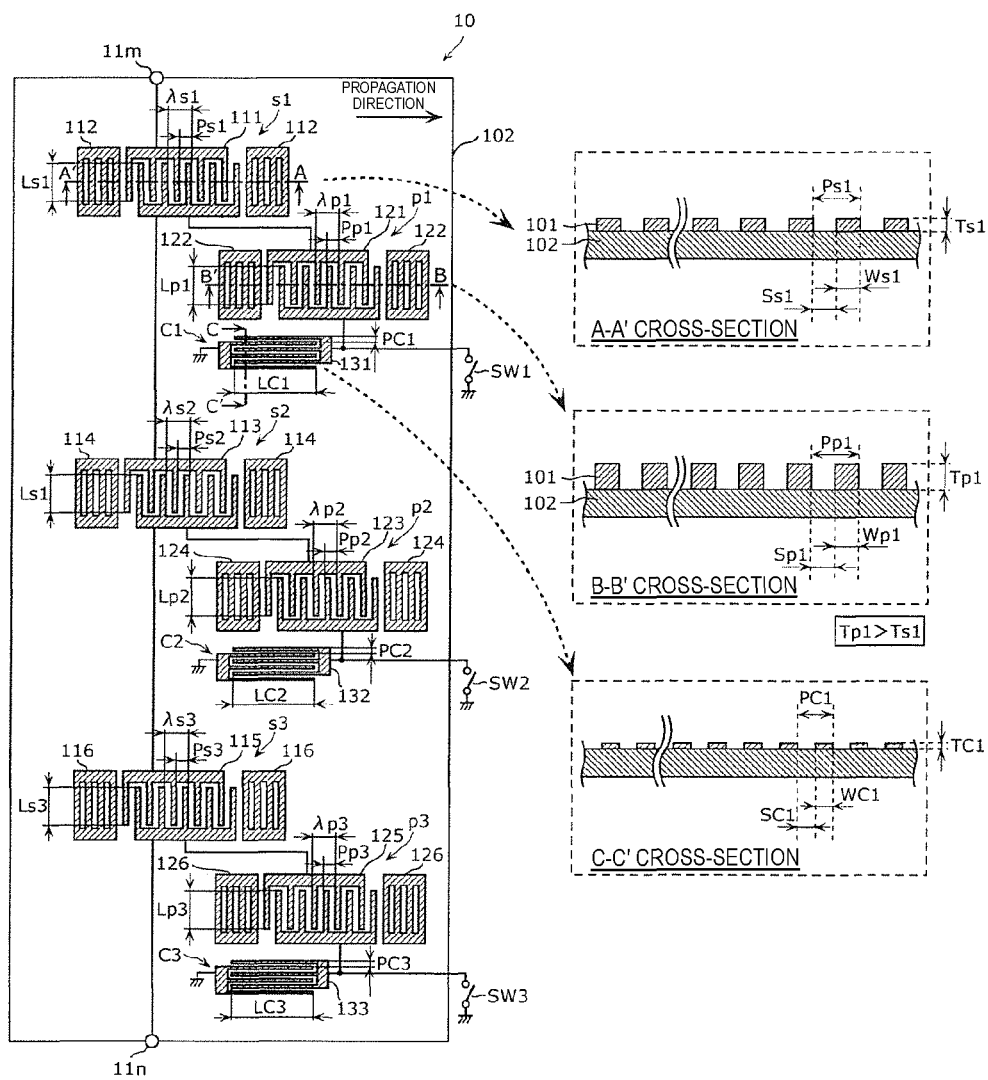
FIG. 3 includes a plan view and cross-sectional views illustrating an electrode configuration of the variable filter according to the first embodiment.

FIG. 3 includes a plan view and cross-sectional views illustrating an electrode configuration of the variable filter 10 according to the first embodiment. The plan view of the electrode configuration of the variable filter 10 is illustrated on a left side of FIG. 3, the cross-sectional view of the serial arm resonator s1 of the variable filter 10 taken along a line A-A' is illustrated on an upper right side of FIG. 3, and the cross-sectional view of the parallel arm resonator p1 of the variable filter 10 taken along a line B-B' is illustrated on a middle right side of FIG. 3.

As illustrated on the left side of FIG. 3, in an outer peripheral portion on a surface of a substrate 102, the input and output terminals 11m and 11n are arranged. Additionally, on the surface of the substrate 102, an IDT electrode 111 and reflectors 112 configuring the serial arm resonator s1, an IDT electrode 113 and reflectors 114 configuring the serial arm resonator s2, and an IDT electrode 115 and reflectors 116 configuring the serial arm resonator s3 are formed. Additionally, on the surface of the substrate 102, an IDT electrode 121 and reflectors 122 configuring the parallel arm resonator p1, an IDT electrode 123 and reflectors 124 configuring the parallel arm resonator p2, and an IDT electrode 125 and reflectors 126 configuring the parallel arm resonator p3 are formed. Furthermore, on the surface of the substrate 102, comb-tooth capacitance electrodes 131, 132, and 133 are formed. Furthermore, although not illustrated in detail, on the surface of the substrate 102, respective wirings for connecting the input and output terminals 11m and 11n, the IDT electrodes 111, 113, 115, 121, 123, and 125, and the comb-tooth capacitance electrodes 131, 132, and 133 are formed.

The substrate 102 is a substrate at least part of which has piezoelectricity. For example, the substrate may include a piezoelectric thin film on the surface thereof and may be configured of a multilayer body of a film having a different acoustic velocity from that of the piezoelectric thin film, a support substrate, and the like. In addition, the substrate 102 may have the piezoelectricity on the entire substrate. In this case, the substrate 102 is a piezoelectric substrate formed of a single piezoelectric body layer.

The IDT electrode 111 and the reflectors 112 are each constituted of a plurality of electrode fingers and configure the serial arm resonator s1 together with the substrate 102. The IDT electrode 113 and the reflectors 114 are each constituted of a plurality of electrode fingers and configure the serial arm resonator s2 together with the substrate 102. The IDT electrode 115 and the reflectors 116 are each constituted of a plurality of electrode fingers and configure the serial arm resonator s3 together with the substrate 102. The IDT electrode 121 and the reflectors 122 are each constituted of a plurality of electrode fingers and configure the parallel arm resonator p1 together with the substrate 102. The IDT electrode 123 and the reflectors 124 are each constituted of a plurality of electrode fingers and configure the parallel arm resonator p2 together with the substrate 102. The IDT electrode 125 and the reflectors 126 are each constituted of a plurality of electrode fingers and configure the parallel arm resonator p3 together with the substrate 102. Here, an extending direction of the electrode fingers of the IDT electrodes 111, 113, and 115 and an extending direction of the electrode fingers of the IDT electrodes 121, 123, and 125 substantially coincide with each other, and the extending direction is a direction perpendicular to a propagation direction of the substrate 102. With this configuration, the serial arm resonators s1 to s3 and the parallel arm resonators p1 to p3 excite an acoustic wave in the same propagation direction.

The comb-tooth capacitance electrodes 131, 132, and 133 are each constituted of a plurality of electrode fingers and are formed on the substrate 102. Here, an extending direction of the electrode fingers of the comb-tooth capacitance electrodes 131 to 133 and the extending direction of the electrode fingers of the IDT electrodes described above intersect with each other. The comb-tooth capacitance electrode 131 configures, together with the substrate 102, the capacitance element C1 (capacitor) which is a comb-tooth capacitance. The comb-tooth capacitance electrode 132 configures, together with the substrate 102, the capacitance element C2 (capacitor) which is a comb-tooth capacitance. The comb-tooth capacitance electrode 133 configures, together with the substrate 102, the capacitance element C3 (capacitor) which is a comb-tooth capacitance.

With the above-described electrode configuration, since the serial arm resonators, the parallel arm resonators, and the capacitance elements configuring the variable filter 10 can be formed on the same substrate 102, the variable filter 10 can be miniaturized. Additionally, by adjusting a pitch, the number of pairs, a cross-width, and the like of the electrode fingers which configure the comb-tooth capacitance electrodes 131 to 133, it is possible to set the capacitance value in accordance with the frequency variable width.

The switches SW1, SW2, and SW3 are arranged outside the substrate 102, and are connected to the comb-tooth capacitance electrodes 131, 132, and 133, respectively. Note that in order to save the area, the switches SW1 to SW3 may be arranged on the substrate 102.

Here, as illustrated on the right side of FIG. 3, the film thickness of the plurality of electrode fingers of each of the parallel arm resonators p1, p2, and p3 is larger than the film thickness of the plurality of electrode fingers of each of the serial arm resonators s1, s2, and s3. In other words, a film thickness (Tp) of each of the IDT electrodes 121, 123, and 125 is larger than a film thickness (Ts) of each of the IDT electrodes 111, 113 and 115. With this, the frequency interval between the fundamental mode resonance point and the higher-order mode resonance point of each of the parallel arm resonators p1, p2, and p3 becomes larger than the frequency interval between the fundamental mode resonance point and the higher-order mode resonance point of each of the serial arm resonators s1, s2, and s3. With this, since the higher-order mode anti-resonant frequency of each of the serial arm resonators s1, s2, and s3 and the higher-order mode resonant frequency of each of the parallel arm resonators p1, p2, and p3 can be brought close to each other, the attenuation characteristics of the higher-order mode generation frequency band (the attenuation band on the higher-frequency side than the pass band) can be improved.

Note that the plurality of electrode fingers configuring the IDT electrodes, the reflectors, and the comb-tooth capacitance electrodes described above may be configured of a single-layered metal film or may be configured of a multi-layer body of a plurality of metal films as described below.

In the serial arm resonators s1, s2, and s3 and the parallel arm resonators p1, p2, and p3 described above, a wave length of the acoustic wave to be excited is defined by design parameters and the like of the IDT electrode. Hereinafter, the design parameters of the IDT electrode will be described using the parallel arm resonator p1 as an example.

The wave length of the acoustic wave is defined by a repetition period $\lambda p1$ of the electrode fingers connected to one busbar electrode among the plurality of electrode fingers. Furthermore, an electrode finger pitch (a pitch of the plurality of electrode fingers, that is, an electrode finger period) Pp1 is ½ of the repetition period $\lambda p1$, and is defined, when a line width of the electrode finger is taken as Wp1 and a space width between adjacent electrode fingers is taken as Sp1, by Pp1=(Wp1+Sp1). Furthermore, a cross-width Lp1 of the IDT electrode 121 is an overlapping electrode finger length when the electrode finger connected to one and the electrode finger connected to the other of a single pair of busbar electrodes are viewed from the propagation direction of the acoustic wave. Furthermore, an electrode duty (duty ratio) is a line width occupation ratio of the plurality of electrode fingers and is defined by a ratio of the line width to an addition value of the line width and the space width of the plurality of electrode fingers, that is, Wp1/(Wp1+Sp1). In other words, the electrode duty is defined by a ratio of the width of each of the plurality of electrode fingers to the electrode finger pitch (a pitch of the plurality of electrode fingers), that is, Wp1/Pp1. In addition, the number of pairs is the number of electrode fingers that form the pairs and is approximately half of the total number of electrode fingers. For example, when the number of pairs is taken as Np1 and the total number of electrode fingers is taken as Mp1, Mp1=2Np1+1 is satisfied. Furthermore, the film thickness of the electrode finger is a thickness Tp1 of an electrode film 101 forming the electrode fingers.

Next, a structure of each of the comb-tooth capacitance electrodes 131 to 133 will be described using the comb-tooth capacitance electrode 131 as an example.

The comb-tooth capacitance electrode 131 is configured of a plurality of electrode fingers. As illustrated in FIG. 3, the comb-tooth capacitance electrode 131 is configured of the electrode film 101 in the same manner as the IDT electrode 121. In other words, the comb-tooth capacitance electrode 131 configuring the capacitance element C1 is formed on the same substrate 102 as the IDT electrode 121 configuring the parallel arm resonator p1. Note that the comb-tooth capacitance electrode 131 and the IDT electrode 121 may be formed on different substrates from each other.

The comb-tooth capacitance electrode 131 includes the plurality of electrode fingers and a single pair of busbar electrodes arranged so as to oppose each other with the plurality of electrode fingers sandwiched therebetween and is configured by alternately connecting the plurality of electrode fingers to one and the other of the single pair of busbar electrodes. Here, the plurality of electrode fingers is formed along the propagation direction of the acoustic wave and are periodically formed along a direction orthogonal to the propagation direction.

In the capacitance element C1 configured as described above, characteristics such as the capacitance value, a Q value, and the like are defined depending on design parameters and the like of the comb-tooth capacitance electrode 131. Hereinafter, the design parameters of the comb-tooth capacitance electrode 131 will be described.

An electrode finger pitch (a pitch of the electrode fingers, that is, an electrode finger period) PC1 is defined, when a line width of the electrode finger is taken as WC1 and a space width between the adjacent electrode fingers is taken as SC1, by PC1=(WC1+SC1). Furthermore, a cross-width LC1 of the comb-tooth capacitance electrode 131 is an overlapping electrode finger length when the electrode finger connected to one and the electrode finger connected to the other of the single pair of busbar electrodes are viewed from the propagation direction of the acoustic wave. Furthermore, an electrode duty (duty ratio) is a line width occupation ratio of the plurality of electrode fingers and is defined by a ratio of the line width to an addition value of the line width and the space width of the plurality of electrode fingers, that is, WC1/(WC1+SC1). In other words, the electrode duty is defined by a ratio of a width of each of the plurality of electrode fingers to a pitch of the plurality of electrode fingers, that is, WC1/PC1. In addition, the number of pairs is the number of electrode fingers that form the pairs and is approximately half of the total number of electrode fingers. For example, when the number of pairs is taken as NC1 and the total number of electrode fingers is taken as MC1, MC1=2NC1+1 is satisfied. Furthermore, the film thickness of the electrode finger is a thickness TC1 of the electrode film 101 forming the electrode fingers.

Next, the design parameters of the comb-tooth capacitance electrodes 131 to 133 configuring the capacitance elements C1 to C3, respectively, and the IDT electrodes 121, 123, and 125 of the parallel arm resonators p1 to p3 connected to the capacitance elements C1 to C3, respectively, will be compared and described. Note that the following describes a relationship between the capacitance element C1 among the capacitance elements C1 to C3 and the IDT electrode 121 of the parallel arm resonator p1. This relationship is also applied to a relationship between the capacitance element C2 and the IDT electrode 123 of the parallel arm resonator p2, and a relationship between the capacitance element C3 and the IDT electrode 125 of the parallel arm resonator p3.

The electrode finger pitch of the capacitance element C1 is narrower than the electrode finger pitch of the parallel arm resonator p1 (second acoustic wave resonator). In other words, PC1<Pp1 is satisfied. Here, the pitch of the plurality of electrode fingers of the capacitance element C1 can be equal to or less than 80% of the pitch of the plurality of electrode fingers of the parallel arm resonator p1 (second acoustic wave resonator) (that is, PC1≤0.8×Pp1=0.4×λp1).

In addition, the film thickness of the plurality of electrode fingers of the capacitance element C1 is smaller than the film thickness of the plurality of electrode fingers of the parallel arm resonator p1. In other words, TC1<Tp1 is satisfied. Here, for reasons in manufacturing, in the capacitance element C1, the film thickness TC1 of the electrode finger can be equal to or less than 40% of the electrode finger pitch PC1 (that is, TC1≤0.40×PC1). Furthermore, for the same reason, in the parallel arm resonator p1, the film thickness Tp1 of the electrode finger can be equal to or less than 40% of the electrode finger pitch Pp1 (that is, Tp1≤0.40×Pp1). Furthermore, the lower limit of the film thickness TC1 of the electrode finger is not particularly limited, but is, for example, equal to or more than 15% of the electrode finger pitch PC1 (that is, 0.15×PC1≤TC1). In the same manner, the lower limit of the film thickness Tp1 of the electrode finger is not particularly limited, but is, for example, equal to or more than 15% of the electrode finger pitch Pp1 (that is, 0.15×Pp1≤Tp1).

Furthermore, the electrode duty of the capacitance element C1 can be larger than the electrode duty of the parallel arm resonator p1. In other words, the capacitance element C1 and the parallel arm resonator p1 can satisfy WC1/PC1>Wp1/Pp1. By employing the configuration as described above, since the capacitance value of the capacitance element C1 per unit area can be increased, miniaturization and space saving can be achieved.

Note that in each element (the serial arm resonators s1 to s3, the parallel arm resonators p1 to p3, the capacitance elements C1 to C3, and the like), the electrode finger pitch, the film thickness, the electrode duty, and the like are not always uniform, may be uneven due to variations in a manufacturing process or the like, or may be uneven for adjustment of the characteristics or the like. Therefore, in the capacitance element C1 and the parallel arm resonator p1, the comb-tooth capacitance electrode 131 and the IDT electrode 121 configuring them do not partially satisfy the relationships of the electrode finger pitch, the film thickness, the electrode duty, and the like as described above in some cases. In other words, it is sufficient that the above-described relationships of the electrode finger pitch, the film thickness, and the electrode duty between the capacitance element C1 and the parallel arm resonator p1 are substantially satisfied, and it is sufficient that the relationships between average values of the capacitance element C1 and average values of the parallel arm resonator p1 are satisfied, for example.

[1.4 Detailed Structure of Electrode Finger]

Here, a case where the plurality of electrode fingers configuring the IDT electrodes, the reflectors, and the comb-tooth capacitance electrodes is configured of the multilayer body of the plurality of metal films will be described. Note that in the following descriptions, each of the IDT electrodes and each of the comb-tooth capacitance electrodes are assumed to be configured of the common electrode film 101 except for a point that the film thicknesses are different from each other but may be configured of electrode films having different structures, compositions, or the like.

Figure 4A:
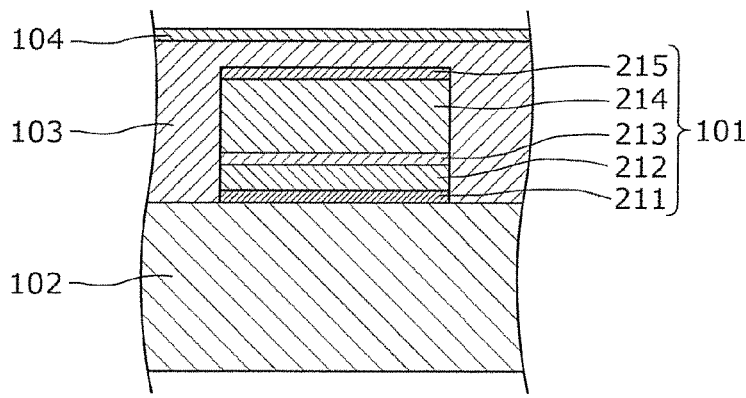
FIG. 4A is a cross-sectional view of a structure of an electrode film and the periphery thereof in the first embodiment.
Figure 4B:
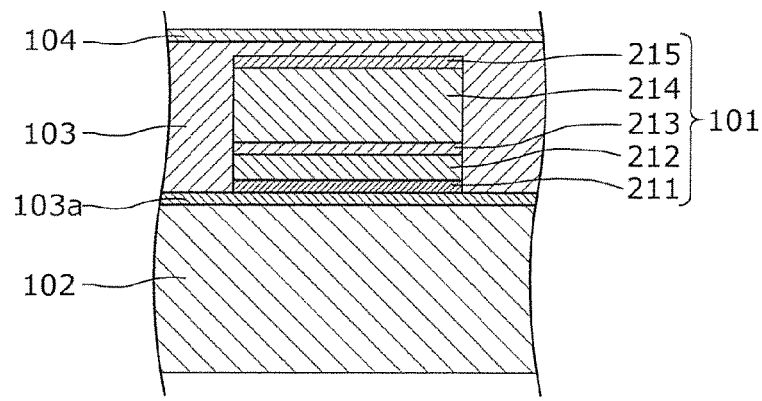
FIG. 4B is a cross-sectional view of another example of the structure of the electrode film and the periphery thereof in the first embodiment.

FIG. 4A is a cross-sectional view of a structure of the electrode film 101, which configures the electrode fingers of the IDT electrode and the electrode fingers of the comb-tooth capacitance electrode, and the periphery thereof according to the first embodiment. FIG. 4B is a cross-sectional view of another example of the structure of the electrode film 101, which configures the electrode fingers of the IDT electrode and the electrode fingers of the comb-tooth capacitance electrode, and the periphery thereof according to the first embodiment.

As illustrated in FIG. 4A, the electrode film 101 is formed by laminating a metal film 211 made of NiCr, a metal film 212 made of Pt, a metal film 213 made of Ti, a metal film 214 made of AlCu, and a metal film 215 made of Ti in this order from the substrate 102 side. In this case, the substrate 102 is made of, for example, $LiNbO_3$ piezoelectric single crystal.

Furthermore, the electrode film 101 is covered with a protective layer having purposes such as adjusting frequency temperature characteristics and improving moisture resistance, as well as protecting the electrode film 101 from an external environment. In the present embodiment, the protective layer is formed by laminating a protective layer 103 made of $SiO_2$ and a protective layer 104 made of SiN in this order from the substrate 102 side.

Note that as illustrated in FIG. 4B, an adjustment film 103a for adjusting an electromechanical coupling coefficient may be provided between the electrode film 101 and the substrate 102. The adjustment film 103a for adjusting the electromechanical coupling coefficient is made of $SiO_2$.

The metal film 212 made of Pt is a metal film having the highest density among the plurality of metal films 211 to 215 configuring the multilayer body. Furthermore, the metal films 211, 213, 214, and 215 configure metal films other than the metal film 212 having the highest density.

The above-described variable filter 10 according to the first embodiment is characterized in that, by assuming that the plurality of electrode fingers configuring the IDT electrode and the comb-tooth capacitance electrode is configured of the single-layered metal film, the film thickness of the plurality of electrode fingers of the parallel arm resonators p1, p2, and p3 is larger than the film thickness of the plurality of electrode fingers of the serial arm resonators s1, s2, and s3.

Instead of this configuration, as illustrated in FIG. 4A and FIG. 4B, the variable filter 10 according to the first embodiment may be characterized in that, when the plurality of electrode fingers configuring the IDT electrode and the comb-tooth capacitance electrode is configured of the multilayer body of the plurality of metal films, a film thickness of the metal film 212 having the highest density among the plurality of metal films forming the plurality of electrode fingers of the parallel arm resonators p1, p2, and p3 is larger than a film thickness of the metal film 212 having the highest density among the plurality of metal films forming the plurality of electrode fingers of the serial arm resonators s1, s2, and s3.

Acoustic wave propagation characteristics of the acoustic wave resonator are greatly affected by a weight of the IDT electrode formed on the substrate with piezoelectricity. According to the above configuration, the film thickness of the metal film 212 of the parallel arm resonators p1, p2, and p3 is larger than the film thickness of the metal film 212 of the serial arm resonators s1, s2, and s3, which makes it possible to make an electrode finger weight of the parallel arm resonators p1, p2, and p3 respectively configuring the parallel arm resonance circuits 21 to 23 larger than an electrode finger weight of the serial arm resonators s1, s2, and s3. Accordingly, the frequency interval between the fundamental mode resonance point and the higher-order mode resonance point of each of the parallel arm resonators p1, p2, and p3 becomes larger than the frequency interval between the fundamental mode resonance point and the higher-order mode resonance point of each of the serial arm resonators s1, s2, and s3. With this, since the higher-order mode anti-resonant frequency of each of the serial arm resonators s1, s2, and s3 and the higher-order mode resonant frequency of each of the parallel arm resonators p1, p2, and p3 can be brought close to each other, the attenuation characteristics of the higher-order mode generation frequency band (the attenuation band on the higher-frequency side than the pass band) can be improved.

Note that in this case, a film thickness of the metal films of the parallel arm resonators p1, p2, and p3 other than the metal film 212 (an added film thickness obtained by adding the film thicknesses of the metal films 211, 213, 214, and 215) can be equal to or smaller than a film thickness of the metal films of the serial arm resonators s1, s2, and s3 other than the metal film 212 (an added film thickness obtained by adding the film thicknesses of the metal films 211, 213, 214, and 215).

By making the film thickness of the high-density metal film 212 of the parallel arm resonators p1, p2, and p3 larger than the film thickness of the high-density metal film 212 of the serial arm resonators s1, s2, and s3, the attenuation characteristics of the higher-order mode generation frequency band (the attenuation band on the higher-frequency side than the pass band) can be improved. On the other hand, the metal film 212 having the highest density tends to have a higher resistivity than the metal films other than the metal film 212. Additionally, by reducing resistance of the electrode fingers of the IDT electrode, the Q value at the resonance point of the acoustic wave resonator is improved. From this viewpoint, the film thickness of the metal films other than the metal film 212 among the plurality of metal films of the serial arm resonators s1, s2, and s3, which form the pass band by the resonance point of the fundamental mode, (the added film thickness obtained by adding the film thicknesses of the metal films 211, 213, 214, and 215) can be larger than the film thickness of the metal films other than the metal film 212 among the plurality of metal films of the parallel arm resonators p1, p2, and p3 (the added film thickness obtained by adding the film thicknesses of the metal films 211, 213, 214, and 215). With this configuration, the Q value at the resonance point of the serial arm resonators s1, s2, and s3 can be improved, and the insertion loss in the pass band of the acoustic wave device can be reduced.

Note that the configurations of the electrode film 101 illustrated in FIG. 4A and FIG. 4B are merely examples and are not limited thereto. As described above, the electrode film 101 may be formed of a single layer of the metal film instead of the laminated structure of the metal films. Furthermore, the material configuring each of the metal films and each of the protective layers is not limited to the materials described above. Furthermore, the electrode film 101 may be configured of a metal such as Ti, Al, Cu, Pt, Au, Ag, or Pd, or an alloy thereof, for example, or may be configured of a plurality of multilayer bodies configured of the above metal or alloy. In addition, the substrate 102 may be made of, for example, $LiTaO_3$ piezoelectric single crystal, $KNbO_3$ piezoelectric single crystal, crystal, or piezoelectric ceramics. Furthermore, the configurations of the protective layers 103 and 104 and the adjustment film 103a for adjusting the electromechanical coupling coefficient are not limited to the above-described configurations, and may be configured of, for example, a dielectric or an insulator such as $SiO_2$, SiN, A/N, polyimide, or a multilayer body thereof. In addition, the protective layers 103 and 104 may not be formed.

[1.5 Variable Filter Resonance Characteristics]

Next, resonance characteristics of a case where the film thickness of the plurality of electrode fingers configuring the acoustic wave resonator is changed will be described.

Figure 5A:
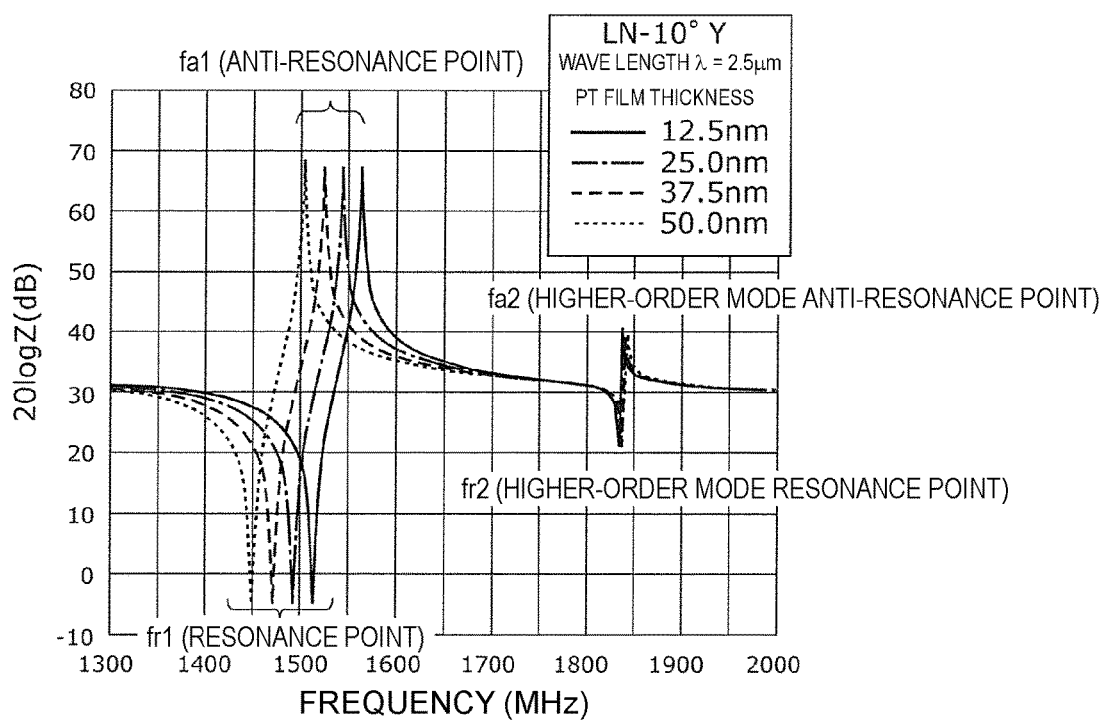
FIG. 5A is a graph showing resonance characteristics of a surface acoustic wave resonator when an electrode film thickness is changed.
Figure 5B:
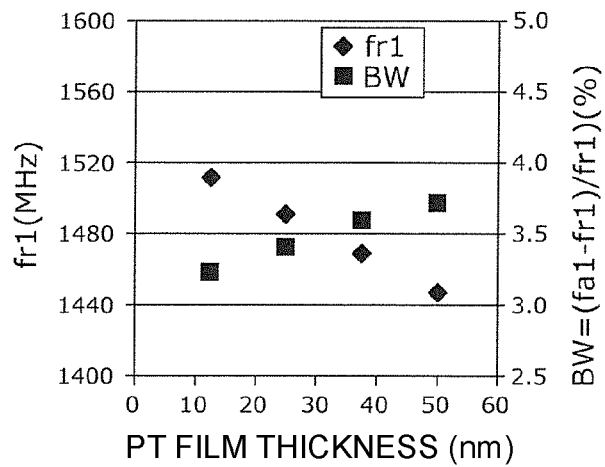
FIG. 5B is a graph showing a resonant frequency and a resonance band width of a fundamental mode when the electrode film thickness is changed.

FIG. 5A is a graph showing the resonance characteristics of a surface acoustic wave resonator when the electrode film thickness is changed. Furthermore, FIG. 5B is a graph showing the resonant frequency and the resonance band width of the fundamental mode when the electrode film thickness is changed. Furthermore, FIG. 5C is a graph showing an fr ratio and an impedance ratio when the electrode film thickness is changed.

FIG. 5A shows, in the surface acoustic wave resonator having the IDT electrode configured of the substrate 102 using −10° Y-cut X-propagation LiNbO$_3$ piezoelectric single crystal and the electrode film 101 illustrated in FIG. 4A, the resonance characteristics when the film thickness of the metal film 212 is changed.

As shown in FIG. 5A and FIG. 5B, as the film thickness of the metal film 212 made of Pt increases, the resonant frequency (fr1) and the anti-resonant frequency (fa1) of the fundamental mode are shifted to the lower-frequency side, but generation frequencies of the resonance point and the anti-resonance point of the higher-order mode hardly changes. That is, depending on the film thickness of the high-density metal film 212, the frequency interval between the resonance point (anti-resonance point) of the fundamental mode and the resonance point (anti-resonance point) of the higher-order mode changes. Additionally, as shown in FIG. 5B, as the film thickness of the high-density metal film 212 increases, the resonance band width (fa1−fr1) of the fundamental mode increases. Additionally, as shown in FIG. 5C, as the film thickness of the high-density metal film 212 increases, the fr ratio (fr2/fr1) increases, and the impedance ratio (Zfa1/Zfr1) decreases.

Figure 5C:
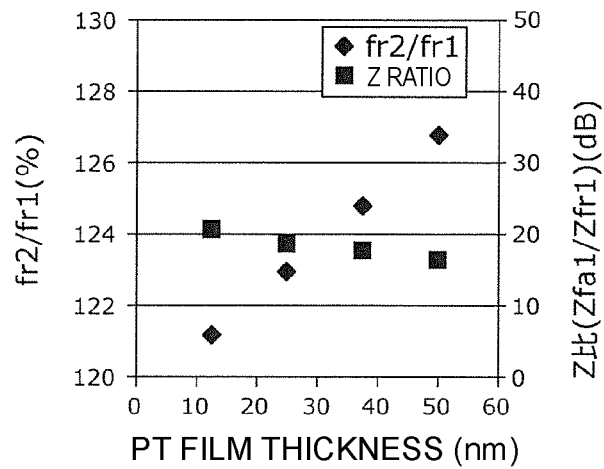
FIG. 5C is a graph showing a higher-order mode resonant frequency/the fundamental mode resonant frequency and a fundamental mode impedance ratio when the electrode film thickness is changed.

From the results in FIG. 5A to FIG. 5C, when the film thickness of the high-density metal film 212 is changed, by adjusting the electrode parameters (e.g., the pitch of the electrode fingers, and the like) other than the film thickness so as not to shift the resonant frequency (anti-resonant frequency) of the fundamental mode, it is possible to shift the resonant frequency (anti-resonant frequency) of the higher-order mode. From this viewpoint, as the film thickness of the high-density metal film 212 increases, it is possible to shift the resonant frequency (anti-resonant frequency) of the higher-order mode to the higher-frequency side while fixing the resonant frequency (anti-resonant frequency) of the fundamental mode. Furthermore, as the film thickness of the metal film 212 increases, since the resonance band width (fa1−fr1) of the fundamental mode increases, it is possible to secure a large frequency variable width of the variable filter 10.

[1.6 Characteristics of Capacitance Element]

In the variable filter 10 according to the present embodiment, by the electrode finger pitches and the film thicknesses of the parallel arm resonators p1 to p3 (second acoustic wave resonators) and the capacitance elements C1 to C3 satisfying the above relationships, an effect in which both the Q value of each of the parallel arm resonators p1 to p3 (second acoustic wave resonators) and the Q value of each of the capacitance elements C1 to C3 are secured can be obtained.

This is because the characteristics of the capacitance element C1 depend on the design parameters. Therefore, the reason why the above-described effect is obtained will be described below using a comb-tooth capacitance of a typical example. Note that a configuration of the comb-tooth capacitance of the typical example is the same as that of the capacitance element C1, except for a point that a numerical range of the design parameter is not limited to a numerical range of the capacitance element C1.

[1.6.1 Relation with Electrode Finger Pitch]

First, descriptions will be given of a relation between the electrode finger pitch and the characteristics of the comb-tooth capacitance of the typical example. Note that at this time, the design parameters other than the electrode finger pitch are constant, the electrode duty is 0.60 (that is, WC1/PC1=0.60), and a ratio of the film thickness to the electrode finger pitch is 0.20 (that is, TC1=0.20×PC1).

Figure 6A:
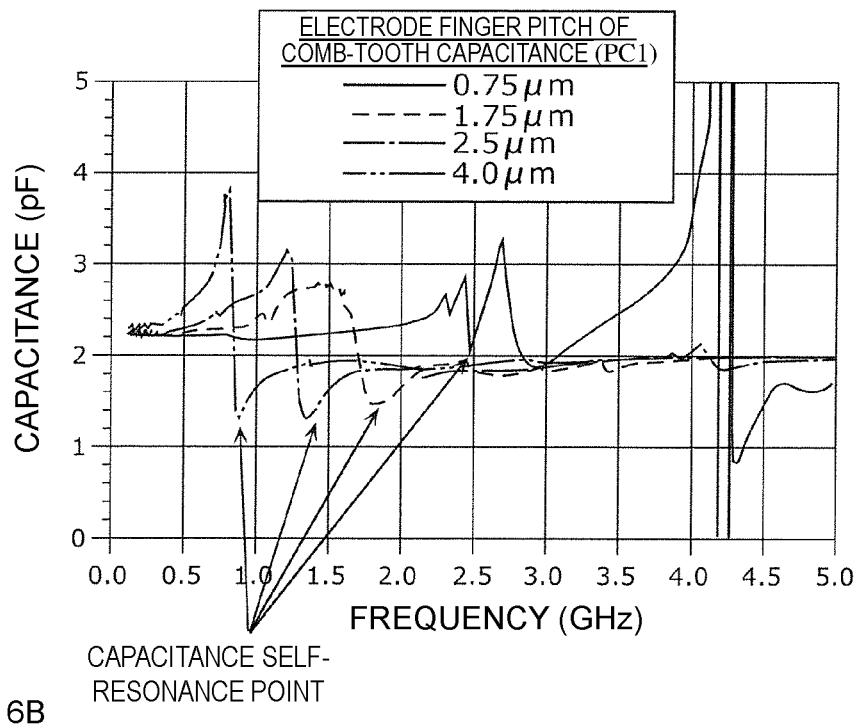
FIG. 6A is a graph showing a relation between an electrode finger pitch and a capacitance value of a comb-tooth capacitance in a typical example.
Figure 6B:
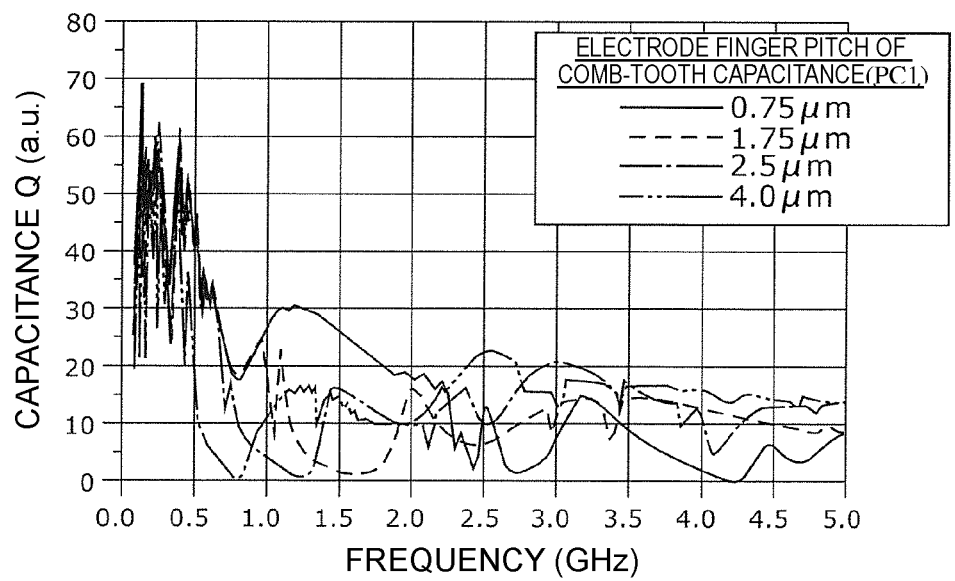
FIG. 6B is a graph showing a relation between the electrode finger pitch and a capacitance Q of the comb-tooth capacitance in the typical example.

FIG. 6A is a graph showing a relation between the electrode finger pitch PC1 and the capacitance value of the comb-tooth capacitance in the typical example. FIG. 6B is a graph showing a relation between the electrode finger pitch PC1 and the Q value (capacitance Q) of the comb-tooth capacitance in the typical example. Specifically, these graphs each show frequency characteristics when the electrode finger pitch PC1 is set to 0.75, 1.75, 2.50, and 4.00 (the unit is μm in each case).

As shown in FIG. 6A, even if the electrode finger pitch PC1 is changed, the capacitance value hardly changes. Note that the capacitance value described herein is a capacitance value (electrostatic capacitance value) in a low frequency region in which an influence due to self-resonance of the comb-tooth capacitance is almost negligible.

On the other hand, as shown in FIG. 6A, in the comb-tooth capacitance, as the electrode finger pitch PC1 becomes narrower, the self-resonance point shifts to the higher-band side. At this time, as shown in FIG. 6B, the Q value (capacitance Q) of the comb-tooth capacitance approximately drops as the frequency increases, but locally drops at the self-resonance point. Therefore, by narrowing the electrode finger pitch PC1 and driving the self-resonance point of the comb-tooth capacitance to the higher-band side than the pass band of the variable filter 10, it is possible to increase the Q value of the comb-tooth capacitance in the pass band. Here, the self-resonance point refers to a frequency of a singular point at which the Q value (capacitance Q) of the comb-tooth capacitance locally drops.

In other words, as the electrode finger pitch PC1 widens, the self-resonance point of the comb-tooth capacitance shifts to the lower-band side. Therefore, the frequency of the self-resonance point is identical, in some cases, to the frequency of the resonance point or the anti-resonance point of the second acoustic wave resonator (in the present embodiment, the parallel arm resonator p1) connected to the comb-tooth capacitance without necessarily interposing another acoustic wave resonator. In other words, the frequency of the resonance point or the anti-resonance point of the second acoustic wave resonator and the frequency at which the capacitance Q locally drops are identical to each other in some cases. In this case, at a resonance point or an anti-resonance point obtained by the combined characteristics of the second acoustic wave resonator and the comb-tooth capacitance, since the Q value drops due to the drop of the Q value of the comb-tooth capacitance, it is difficult to secure a required Q value. Therefore, by narrowing the electrode finger pitch PC1 and driving the self-resonance point of the comb-tooth capacitance to the higher-band side than the resonant frequency and the anti-resonant frequency of the second acoustic wave resonator, it is possible to suppress the Q value of the combined characteristics of the second acoustic wave resonator and the comb-tooth capacitance from dropping and to secure the required Q value.

Additionally, as a matter of course, as the electrode finger pitch PC1 becomes narrower, the comb-tooth capacitance can be made smaller while maintaining the capacitance value, and thus miniaturization and space saving of the filter or the like including the comb-tooth capacitance can be achieved.

[1.6.2 Relation with Electrode Finger Film Thickness]

Next, descriptions will be given of a relation between the film thickness of the electrode fingers and the characteristics of the comb-tooth capacitance of the typical example. Note that at this time, the design parameters other than the film thickness of the electrode fingers are constant, the electrode duty is 0.60 (that is, WC1/PC1=0.60), and the electrode finger pitch PC1 is 2.50 μm.

Figure 7A:
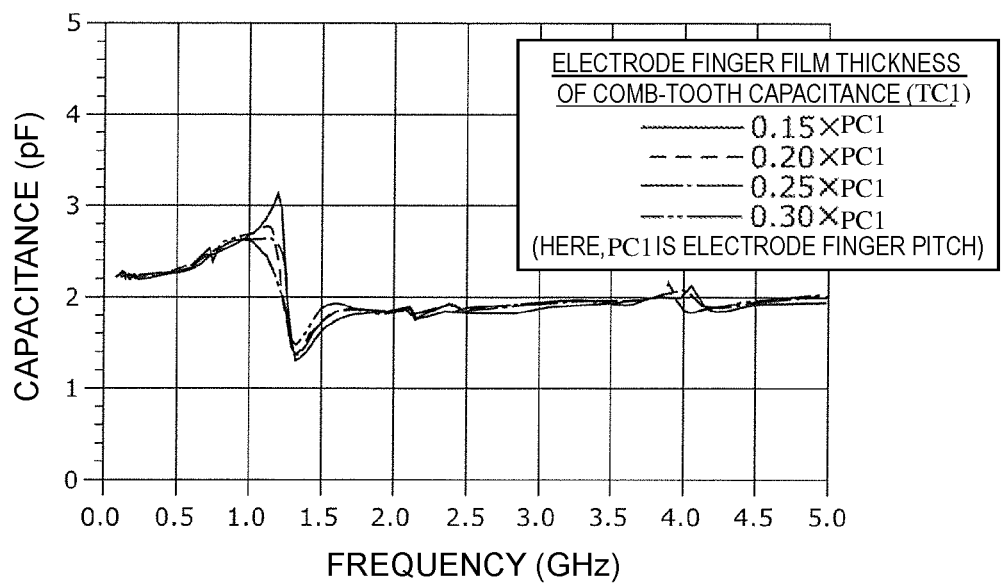
FIG. 7A is a graph showing a relation between a film thickness and the capacitance value of the comb-tooth capacitance in the typical example.
Figure 7B:
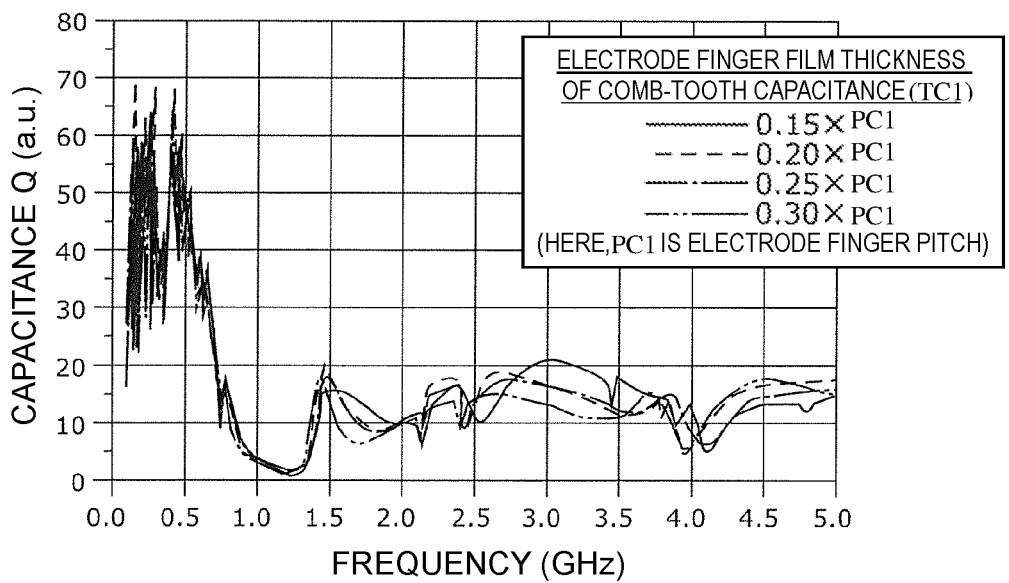
FIG. 7B is a graph showing a relation between the film thickness and the capacitance Q of the comb-tooth capacitance in the typical example.

FIG. 7A is a graph showing a relation between the film thickness TC1 of the electrode fingers and the capacitance value of the comb-tooth capacitance in the typical example. FIG. 7B is a graph showing a relation between the film thickness TC1 of the electrode fingers and the capacitance Q of the comb-tooth capacitance in the typical example.

Specifically, these graphs each show frequency characteristics when a ratio of the film thickness TC1 to the electrode finger pitch PC1 is set to 0.15, 0.20, 0.25, and 0.30.

As shown in these graphs, even if the film thickness TC1 of the electrode fingers is changed, there is no noticeable change in both the capacitance value and the capacitance Q. Therefore, the film thickness TC1 of the electrode fingers may be appropriately determined from a viewpoint of manufacturing.

With respect to this, for reasons in manufacturing, the upper limit of the film thickness TC1 of the electrode fingers is limited by the electrode finger pitch PC1, and specifically, it is necessary to be designed to be equal to or less than 40% of the electrode finger pitch PC1. However, variation in the line width WC1 of the electrode finger increases if the film thickness TC1 is too thick, and the resistance of the electrode fingers increases if the film thickness TC1 is too small, and the film thickness TC1 can be approximately 20% of the electrode finger pitch PC1. Here, the approximately 20% is not limited to 20%, and also includes an error range of approximately several percent.

[1.7 Bandpass Characteristic of Variable Filter]

Here, the bandpass characteristic of the variable filter 10 according to the first embodiment (working example) will be described while being compared with the bandpass characteristic of the variable filter according to the comparative example.

First, in Table 1, the electrode parameters of the serial arm resonators and the parallel arm resonators of the variable filter 10 according to the working example are shown. Furthermore, in Table 2, the electrode parameters of the capacitance elements of the variable filter 10 according to the working example are shown. Note that for the substrate 102, −10° Y-cut X-propagation LiNbO$_3$ piezoelectric single crystal was used.

TABLE 1

|  | Serial Arm Resonator s1 | Serial Arm Resonator s2 | Serial Arm Resonator s3 | Parallel Arm Resonator p1 | Parallel Arm Resonator p2 | Parallel Arm Resonator p3 |
| --- | --- | --- | --- | --- | --- | --- |
| Wave Length of Acoustic Wave λ (μm) | 2.534 | 2.493 | 2.521 | 2.499 | 2.514 | 2.506 |
| The Number of Pairs (pairs) | 120.0 | 80.0 | 75.0 | 100.0 | 170.0 | 90.0 |
| Cross-Width (μm) | 44.9 | 39.0 | 40.1 | 59.0 | 69.5 | 61.5 |
| Duty | 0.50 | ← | ← | ← | ← | ← |
| Protective Layer 104 SiN Film Thickness (nm) | 40.0 | ← | ← | ← | ← | ← |
| Protective Layer 103 SiO$_2$ Film Thickness (nm) | 625.0 | ← | ← | ← | ← | ← |
| Metal Film 215 Ti Film Thickness (nm) | 10.0 | ← | ← | ← | ← | ← |
| Metal Film 214 AlCu Film Thickness (nm) | 12.5 | ← | ← | ← | ← | ← |
| Metal Film 213 Ti Film Thickness (nm) | 10.0 | ← | ← | ← | ← | ← |
| Metal Film 212 Pt Film Thickness (nm) | 12.5 | ← | ← | 50.0 | ← | ← |
| Metal Film 211 NiCr Film Thickness (nm) | 10.0 | ← | ← | ← | ← | ← |

TABLE 2

|  | Capacitance Element C1 | Capacitance Element C2 | Capacitance Element C3 |
| --- | --- | --- | --- |
| Pitch P (μm) | 0.750 | 0.750 | 0.750 |
| The Number of Pairs (pairs) | 230 | 260 | 300 |
| Cross-Width (μm) | 143.7 | 154.8 | 180.7 |
| Duty | 0.70 | ← | ← |
| Protective Layer 104 SiN Film Thickness (nm) | 40.0 | ← | ← |
| Protective Layer 103 SiO$_2$ Film Thickness (nm) | 625.0 | ← | ← |
| Metal Film 215 Ti Film Thickness (nm) | 10.0 | ← | ← |
| Metal Film 214 AlCu Film Thickness (nm) | 120.0 | ← | ← |
| Metal Film 213 Ti Film Thickness (nm) | 10.0 | ← | ← |
| Metal Film 212 Pt Film Thickness (nm) | 10.0 | ← | ← |
| Metal Film 211 NiCr Film Thickness (nm) | 10.0 | ← | ← |

Furthermore, the variable filter 10 according to the present working example is a filter that varies a Band 11 reception band (1475.9-1495.9 MHz) and a Band 21 reception band (1495.9-1510.9 MHz) of the LTE communication standard.

As shown in Table 1, in the variable filter 10 according to the working example, the film thickness of the metal film 212 of the parallel arm resonators p1 to p3 (Pt film thickness: 50 nm) is made larger than the film thickness of the metal film 212 of the serial arm resonators s1 to s3 (Pt film thickness: 12.5 nm).

On the other hand, the variable filter according to the comparative example is different from the variable filter 10 according to the working example in a point that the film thickness of the metal film 212 of the parallel arm resonators p1 to p3 (Pt film thickness: 12.5 nm) is the same as the film thickness of the metal film 212 of the serial arm resonators s1 to s3 (Pt film thickness: 12.5 nm). Note that as described above, the film thickness of the metal film 212 of the parallel arm resonators p1 to p3 of the variable filter according to the comparative example is different from the film thickness of the metal film 212 of the parallel arm resonators p1 to p3 of the variable filter 10 according to the working example. According to only this difference in the film thickness, the variable filter 10 according to the working example and the variable filter according to the comparative example have different resonant frequencies and anti-resonant frequencies of the parallel arm resonators p1 to p3 from each other. However, with respect to this difference, by adjusting the wave length λ of the parallel arm resonators p1 to p3, the variable filter 10 according to the working example and the variable filter according to the comparative example have the frequency relationship under the same condition between the resonance point and the anti-resonance point of the fundamental mode.

Figure 8A:
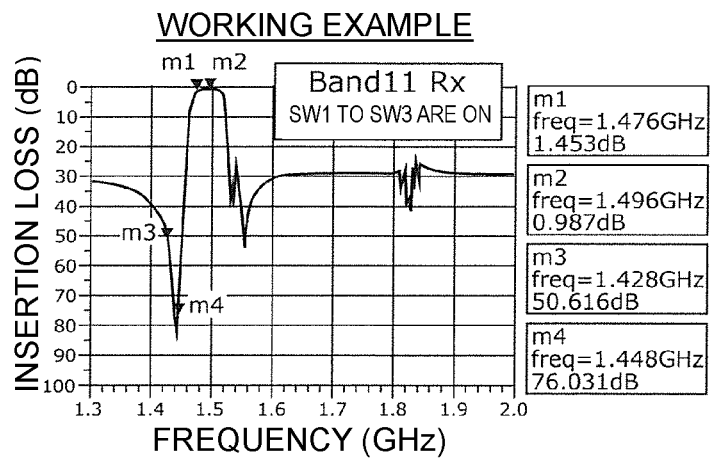
Figure 8B:
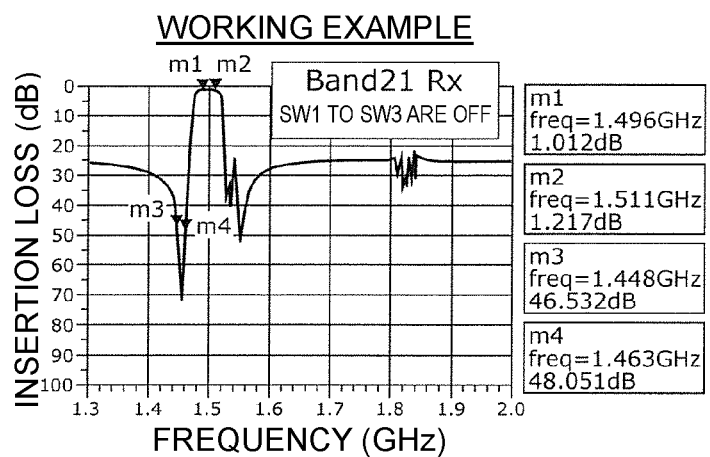
FIG. 8B is a graph showing the bandpass characteristic of the variable filter according to the first embodiment (working example) when being switched off.
Figure 8C:
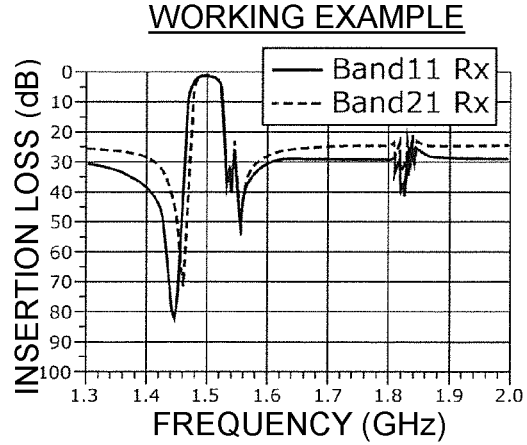
FIG. 8C is a graph showing a comparison of the bandpass characteristics of the variable filter according to the first embodiment (working example) when being switched on and off.

FIG. 8A is a graph showing the bandpass characteristic (Band 11-Rx) of the variable filter 10 according to the working example when being switched on. Furthermore, FIG. 8B is a graph showing the bandpass characteristic (Band 21-Rx) of the variable filter 10 according to the working example when being switched off. Furthermore, FIG. 8C is a graph showing a comparison of the bandpass characteristics of the variable filter according to the working example when being switched on and off.

Figure 9A:
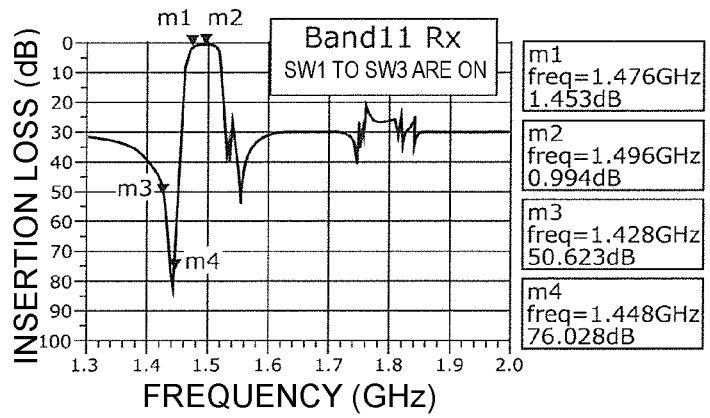
Figure 9B:
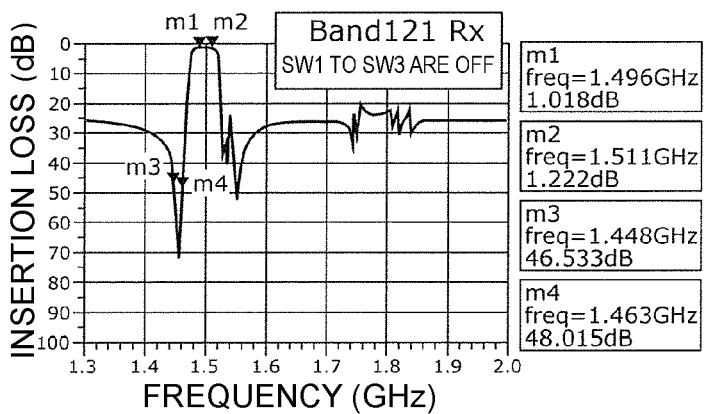
FIG. 9B is a graph showing the bandpass characteristic of the variable filter according to the comparative example when being switched off.
Figure 9C:
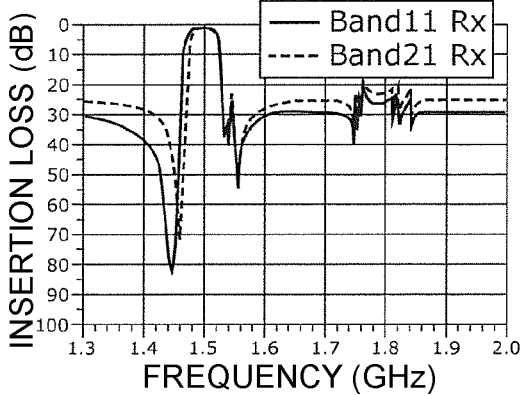
FIG. 9C is a graph showing a comparison of the bandpass characteristics of the variable filter according to the comparative example when being switched on and off.

On the other hand, FIG. 9A is a graph showing the bandpass characteristic (Band 11-Rx) of the variable filter according to the comparative example when being switched on. Furthermore, FIG. 9B is a graph showing the bandpass characteristic (Band 21-Rx) of the variable filter according to the comparative example when being switched off. Furthermore, FIG. 9C is a graph showing a comparison of the bandpass characteristics of the variable filter according to the comparative example when being switched on and off.

Figure 10A:
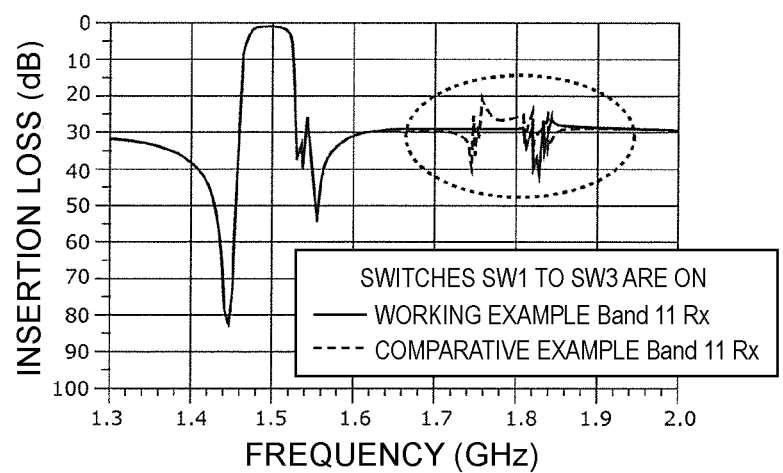

Additionally, FIG. 10A is a graph showing a comparison of the bandpass characteristics (Band 11-RX) of the variable filters according to the working example and the comparative example when being switched on. Furthermore, FIG. 10B is a graph showing a comparison of the bandpass characteristics (Band 21-Rx) of the variable filters according to the working example and the comparative example when being switched off.

Comparing FIG. 8A and FIG. 9A, in the working example and the comparative example, the insertion losses in the pass bands (markers m1 and markers m2 in the graphs) are almost the same, and the attenuations of low-band attenuation bands in the vicinity of the pass bands (markers m3 and markers m4 in the graphs) are also almost the same. Furthermore, comparing FIG. 8B and FIG. 9B, in the working example and the comparative example, the insertion losses in the pass bands (the markers m1 and the markers m2 in the graphs) are almost the same, and the attenuations of the low-band attenuation bands in the vicinity of the pass bands (the markers m3 and the markers m4 in the graphs) are also almost the same.

Figure 10B:
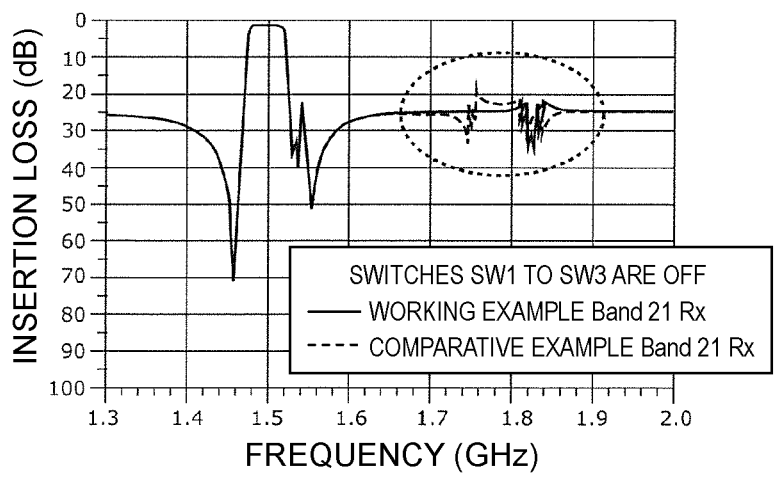
FIG. 10B is a graph showing a comparison of the bandpass characteristics of the variable filters according to the working example and the comparative example when being switched off.

In contrast, as shown in FIG. 10A and FIG. 10B, in the vicinity of the higher-order mode resonant frequency on the higher-frequency side than the pass band (in the broken line of the graph), the working example has the larger attenuation than that in the comparative example. Note that this higher-order mode resonance is mainly caused by an SH (Shear Horizontal) wave higher-order mode. In other words, as compared with the variable filter according to the comparative example, the variable filter 10 according to the working example improves the attenuation characteristics on the higher-frequency side than the pass band while maintaining the pass band insertion loss and the attenuation in the vicinity thereof. A factor of this will be described with reference to FIGS. 11AA-11AD and FIGS. 11BA-11BD.

Figure 11A:
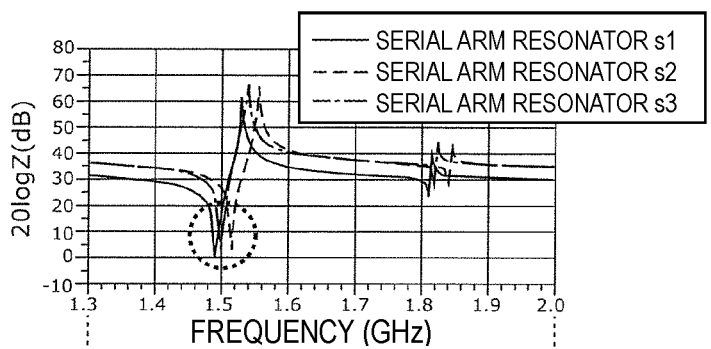
FIGS. 11AA-11AD include graphs showing resonance characteristics and the bandpass characteristics of the variable filter according to the working example in a wide band.
Figure 11A:
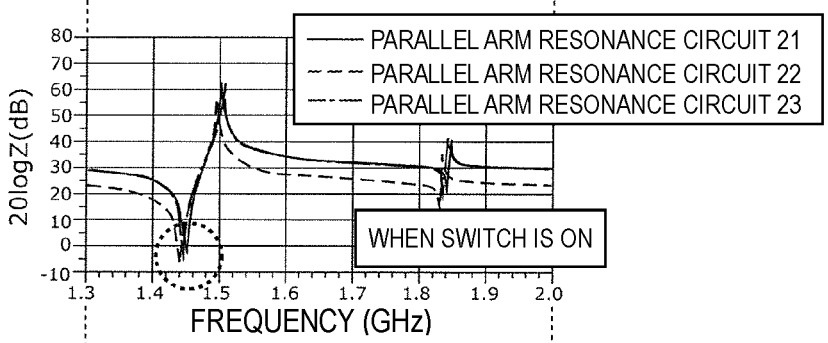
Figure 11A:
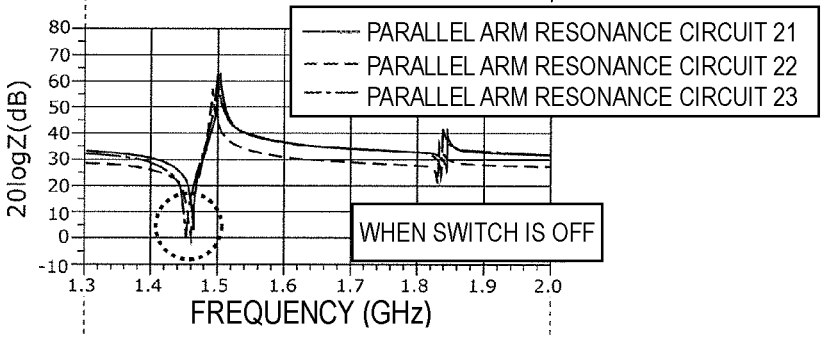
Figure 11A:
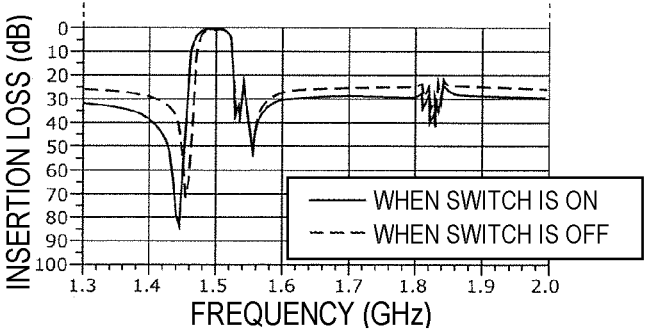
Figure 11B:
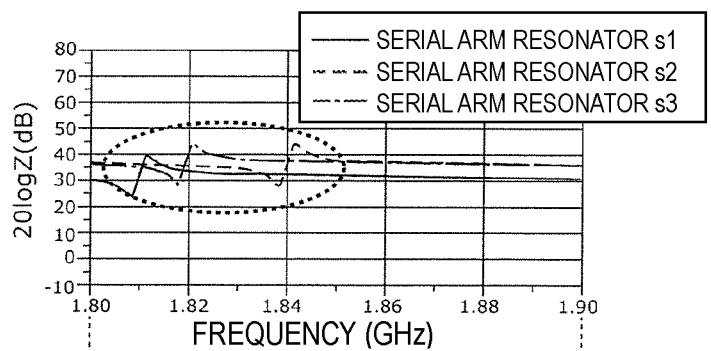
FIGS. 11BA-11BD includes graphs showing the resonance characteristics and the bandpass characteristics of the variable filter according to the working example in a high-band side attenuation band.
Figure 11B:
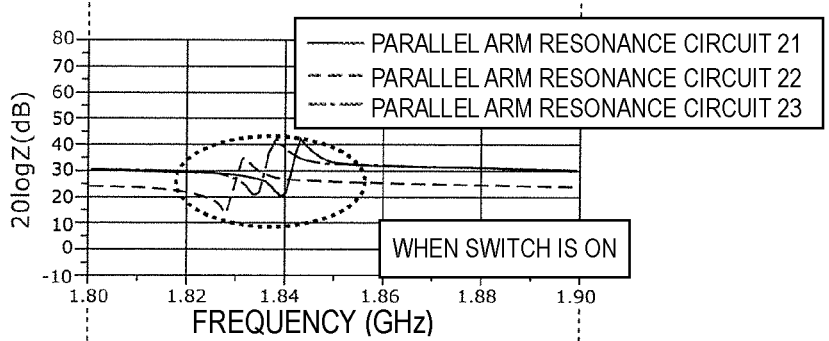
Figure 11B:
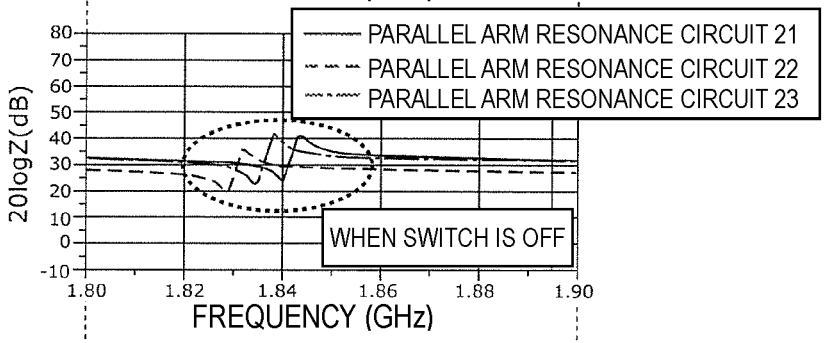
Figure 11B:
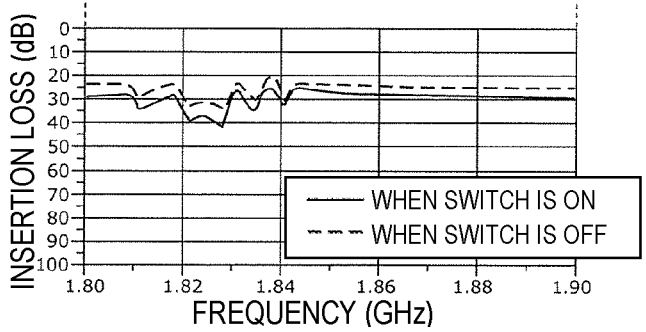

FIGS. 11AA-11AD include graphs showing the resonance characteristics and the bandpass characteristics of the variable filter 10 according to the working example in a wide band (1.3 GHz to 2.0 GHz). Furthermore, FIGS. 11BA-11BD include graphs showing the resonance characteristics and the bandpass characteristics of the variable filter 10 according to the working example in a high-band side attenuation band (1.8 GHz to 1.9 GHz).

FIG. 11AA shows the resonance characteristics of the serial arm resonators s1 to s3, FIG. 11AB shows the resonance characteristics of the parallel arm resonators p1 to p3 when being switched on, FIG. 11AC shows the resonance characteristics of the parallel arm resonators p1 to p3 when being switched off, and FIG. 11AD shows the comparison of the bandpass characteristics of the variable filter 10 when being switched on and off. On the other hand, FIGS. 11BA to 11BD correspond to enlarged graphs of higher-order mode resonance generation bands in FIGS. 11AA to 11AD, respectively. Comparing FIGS. 11BA to 11BC, it can be seen that resonance generation points of the higher-order mode of the parallel arm resonators p1 to p3 are shifted to the higher-frequency side than resonance generation points of the higher-order mode of the serial arm resonators s1 to s3.

In other words, in the variable filter 10 according to the working example, by making the film thickness of the metal film 212 of each of the parallel arm resonators p1 to p3 (Pt film thickness: 50 nm) larger than the film thickness of the metal film 212 of each of the serial arm resonators s1 to s3 (Pt film thickness: 12.5 nm), the frequency interval between the fundamental mode resonance point and the higher-order mode resonance point of the parallel arm resonator becomes larger than the frequency interval between the fundamental mode resonance point and the higher-order mode resonance point of the serial arm resonator. With this, since the frequency of the higher-order mode resonance generation point of the parallel arm resonator and the frequency of the higher-order mode resonance generation point of the serial arm resonator can be brought close to each other, the attenuation characteristics of the higher-order mode generation frequency band (the attenuation band on the higher-frequency side than the pass band) can be improved.

Note that the variable filter 10 need not turn all the switches SW1 to SW3 on/off and may individually turn these switches on/off. However, when all the switches SW1 to SW3 are turned on/off, the number of control lines for controlling the switches SW1 to SW3 can be reduced, so that the configuration of the variable filter 10 can be simplified.

[1.8 Modification of Variable Filter Circuit]

The configurations of the variable filters 10 and 10Z according to the present embodiment can be applied to a configuration of another tunable filter. Accordingly, as modifications of the variable filters according to the present embodiment, configurations and filter characteristics of other tunable filters will be described below.

Note that in variable filter circuit configurations in first to fifth modifications described below, although a ladder-type circuit in which one serial arm resonator and one or two parallel arm resonators are combined is described as examples, as the relationship between the variable filters 10 and 10Z, variable filters having a plurality of stages of the variable filter circuits described in the first to fifth modifications are also included in the variable filters according to the present disclosure.

[1.8.1 First Modification of Variable Filter Circuit]

In the above-described embodiment, the parallel connection circuit of the switch SW1 and the capacitance element C1 has been described as an example of the frequency variable circuit 11. However, the frequency variable circuit is not limited to the configuration as described above.

Figure 12A:
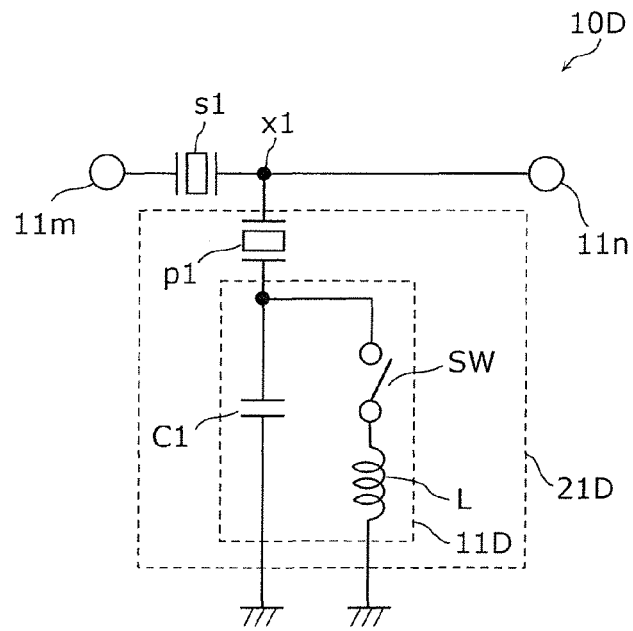
FIG. 12A is a circuit configuration diagram of a variable filter according to a first modification of the first embodiment.

FIG. 12A is a diagram illustrating part of a circuit configuration of a variable filter 10D according to the first modification of the first embodiment.

The variable filter 10D illustrated in the diagram further includes an inductor L connected in series to the switch SW, as compared with the variable filter 10Z illustrated in FIG. 2A. In other words, in the present modification, by connecting a circuit in which the switch SW and the inductor L are connected in series to each other in parallel to the capacitance element C1, a frequency variable circuit 11D is configured. Furthermore, by connecting the frequency variable circuit 11D to the parallel arm resonator p1 (second acoustic wave resonator), a parallel arm resonance circuit 21D is configured.

Note that the connection order between the switch SW and the inductor L is not particularly limited and may be reversed from the connection order illustrated in FIG. 12A.

Figure 12B:
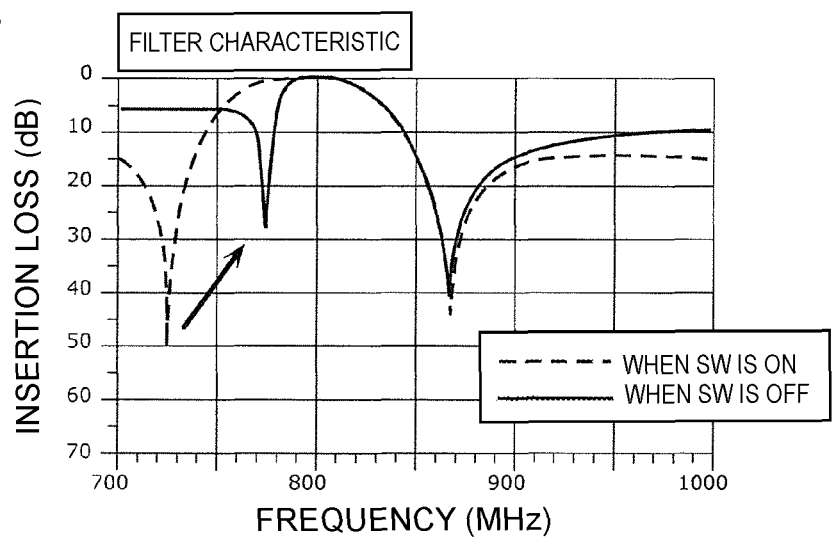
FIG. 12B is a graph showing a bandpass characteristic of the variable filter according to the first modification of the first embodiment.

FIG. 12B is a graph showing a bandpass characteristic of the variable filter 10D according to the first modification of the first embodiment. Specifically, the graph is a graph showing a comparison of the bandpass characteristics when the switch SW is on/off.

In the variable filter 10D, the anti-resonant frequency of the parallel arm resonance circuit 21D and the resonant frequency of the serial arm resonator s1 are brought close to each other to form the pass band.

At this time, in the present modification, to the parallel arm resonator p1, the inductor L is added when the switch SW is on, and the capacitance element C1 is added when the switch SW is off. Therefore, the resonant frequency of the parallel arm resonance circuit 21D shifts to the lower-band side than the resonant frequency of the parallel arm resonator p1 alone when the switch SW is on and shifts to the higher-band side than the resonant frequency of the parallel arm resonator p1 alone when the switch SW is off. Accordingly, as shown in the graph, the variable filter 10D according to the present modification can widen the frequency variable width of the pass band in comparison with the variable filter 10Z according to the first embodiment.

In this regard, the frequency variable width of the pass band of the variable filter 10D depends on the constants of the capacitance element C1 and the inductor L, and as the constant of the inductor increases, for example, the frequency variable width becomes wider. Therefore, the constant of the inductor L can be determined as appropriate based on a frequency specification required for the variable filter 10D. Furthermore, the inductor may be a variable inductor using MEMS (Micro Electro Mechanical Systems). With this, it is possible to finely adjust the frequency variable width.

In the above-described variable filter 10D, the film thickness of the plurality of electrode fingers configuring the IDT electrode of the parallel arm resonator p1 is larger than the film thickness of the plurality of electrode fingers configuring the IDT electrode of the serial arm resonator s1. With this, the frequency interval between the fundamental mode resonance point and the higher-order mode resonance point of the parallel arm resonator p1 becomes larger than the frequency interval between the fundamental mode resonance point and the higher-order mode resonance point of the serial arm resonator s1. With this, since the higher-order mode anti-resonance point of the serial arm resonator s1 and the higher-order mode resonance point of the parallel arm resonator p1 can be subjected to frequency dispersion, the attenuation characteristics of the higher-order mode generation frequency band (the attenuation band on the higher-frequency side than the pass band) can be improved.

Note that the capacitance element C1 and the inductor L may be reversed and provided. In other words, a circuit in which the switch SW and the capacitance element C1 are connected in series to each other may be connected in parallel to the inductor L. According to this configuration, a shift direction of the attenuation pole when the switch SW is turned on/off becomes opposite from that of the variable filter 10D according to the first modification.

[1.8.2 Second Modification of Variable Filter Circuit]

In the first embodiment and the first modification thereof, one parallel arm resonator p1 (second acoustic wave resonator) is provided between the node x1 and the ground. However, a parallel arm resonator (third acoustic wave resonator) different from the parallel arm resonator p1 may be provided between the node x1 and the ground.

Figure 13A:
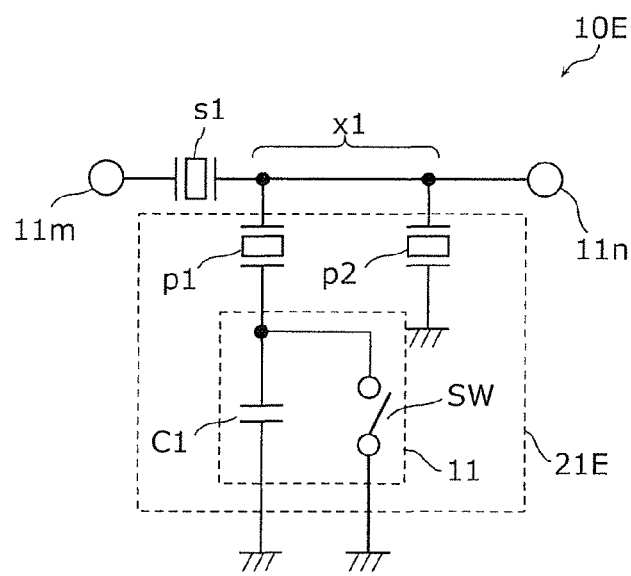
FIG. 13A is a circuit configuration diagram of a variable filter according to a second modification of the first embodiment.

FIG. 13A is a circuit configuration diagram of a filter 10E according to the second modification of the first embodiment.

The variable filter 10E illustrated in the diagram includes a parallel arm resonance circuit 21E instead of the parallel arm resonance circuit 21 included in the variable filter 10Z illustrated in FIG. 2A. In comparison with the parallel arm resonance circuit 21, this parallel arm resonance circuit 21E further includes the parallel arm resonator p2 (third acoustic wave resonator) which is connected between the node x1 and the ground and has a resonant frequency and an anti-resonant frequency different from those of the parallel arm resonator p1. In other words, the parallel arm resonator p1 and the parallel arm resonator p2 are connected to one node x1 on the serial arm connecting the input and output terminal 11m and the input and output terminal 11n. With this configuration, the variable filter 10E can perform frequency shift for at least one of the attenuation pole of the pass band on the low-band side and the attenuation pole of the pass band on the high-band side. Here, "one node" includes not only one point on a transmission line but also two different points located on one transmission line without necessarily interposing a resonator or an impedance element therebetween.

Specifically, the parallel arm resonator p2 has the higher resonant frequency and anti-resonant frequency than those of the parallel arm resonator p1, and the frequency variable circuit 11 is connected in series only to the parallel arm resonator p1 of the parallel arm resonator p1 and the parallel arm resonator p2. In other words, the parallel arm resonator p2 is connected in parallel to a circuit in which the parallel arm resonator p1 and the frequency variable circuit 11 are connected in series to each other.

In the parallel arm resonance circuit 21E configured as described above, an impedance is minimized at the resonant frequency of each of the parallel arm resonators p1 and p2. In other words, the parallel arm resonance circuit 21E has two resonant frequencies. In addition, in the parallel arm resonance circuit 21E, an impedance is maximized in a frequency band between the two resonant frequencies and in a frequency band on a higher-band side than the two resonant frequencies. In other words, the parallel arm resonance circuit 21E has two anti-resonant frequencies.

Figure 13B:
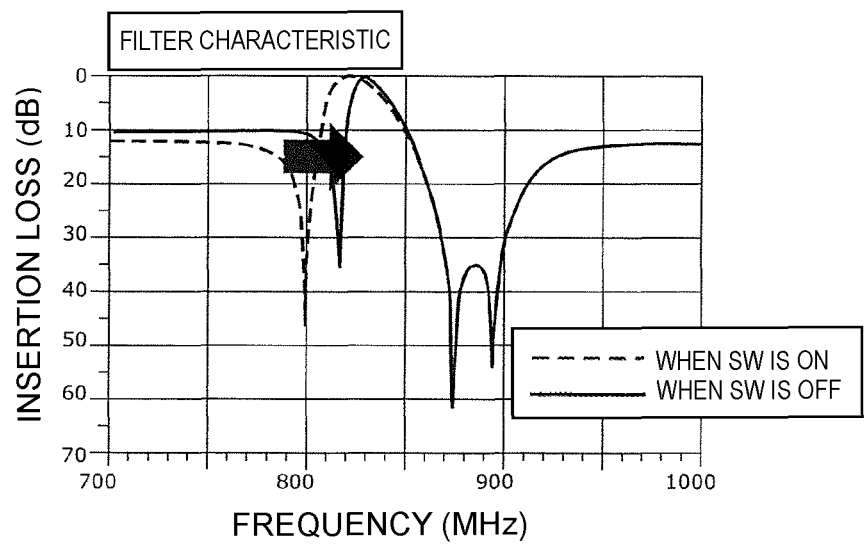
FIG. 13B is a graph showing a bandpass characteristic of the variable filter according to the second modification of the first embodiment.

FIG. 13B is a graph showing a bandpass characteristic of the variable filter 10E according to the second modification of the first embodiment. Specifically, the graph is a graph showing a comparison of the bandpass characteristics when the switch SW is on/off.

In the variable filter 10E, the anti-resonant frequency on the low-band side of two anti-resonant frequencies of the parallel arm resonance circuit 21E and the resonant frequency of the serial arm resonance circuit (in the present modification, the serial arm resonator s1) are brought close to each other to form the pass band.

At this time, in the present modification, to the parallel arm resonator p1, only when the switch SW is off, the capacitance element C1 is added. Therefore, the resonant frequency on the low-band side of the two resonant frequencies of the parallel arm resonance circuit 21E shifts to the higher-band side than the resonant frequency of the parallel arm resonator p1 alone, when the switch SW is off. Additionally, the anti-resonant frequency of the parallel arm resonance circuit 21E on the low-band side shifts to the higher-band side than that when the switch SW is on, when the switch SW is off. Here, the attenuation pole of the pass band on the low-band side of the variable filter 10E is defined by the anti-resonant frequency of the parallel arm resonance circuit 21E on the low-band side. Additionally, the steepness of the attenuation slope of the pass band on the low-band side is defined by a difference frequency between the resonant frequency on the low-band side and the anti-resonant frequency on the low-band side of the parallel arm resonance circuit 21E. Therefore, as shown in the graph, in the variable filter 10E, by switching the switch SW from on to off, while shifting the attenuation pole of the pass band on the low-band side to the higher-band side, without necessarily dropping the shoulder of the pass band on the low-band side, the pass band can be shifted to the higher-band side.

In the above-described variable filter 10E, the film thickness of the plurality of electrode fingers configuring the IDT electrode of the parallel arm resonator p1 is larger than the film thickness of the plurality of electrode fingers configuring the IDT electrode of the serial arm resonator s1. With this, the frequency interval between the fundamental mode resonance point and the higher-order mode resonance point of the parallel arm resonator p1 becomes larger than the frequency interval between the fundamental mode resonance point and the higher-order mode resonance point of the serial arm resonator s1. With this, since the higher-order mode anti-resonant frequency of the serial arm resonator s1 and the higher-order mode resonant frequency of the parallel arm resonator p1 can be dispersed, the attenuation characteristics of the higher-order mode generation frequency band (the attenuation band on the higher-frequency side than the pass band) can be improved.

[1.8.3 Third Modification of Variable Filter Circuit]

In the second modification of the first embodiment, the frequency variable circuit 11 is connected in series only to the parallel arm resonator p1 of the parallel arm resonator p1 and the parallel arm resonator p2. However, the frequency variable circuit 11 may be connected in series only to the parallel arm resonator p2 of the parallel arm resonator p1 and the parallel arm resonator p2.

In other words, in the first embodiment and the first and second modifications, the parallel arm resonator p1 having the resonant frequency on the lower-band side than the pass band of the filter has been described as an example of the second acoustic wave resonator connected to the capacitance element C1 without necessarily interposing another acoustic wave resonator. In contrast, in the present modification, the parallel arm resonator p2 having the resonant frequency on the higher-band side than the pass band of the filter will be described as an example of the second acoustic wave resonator.

Figure 14A:
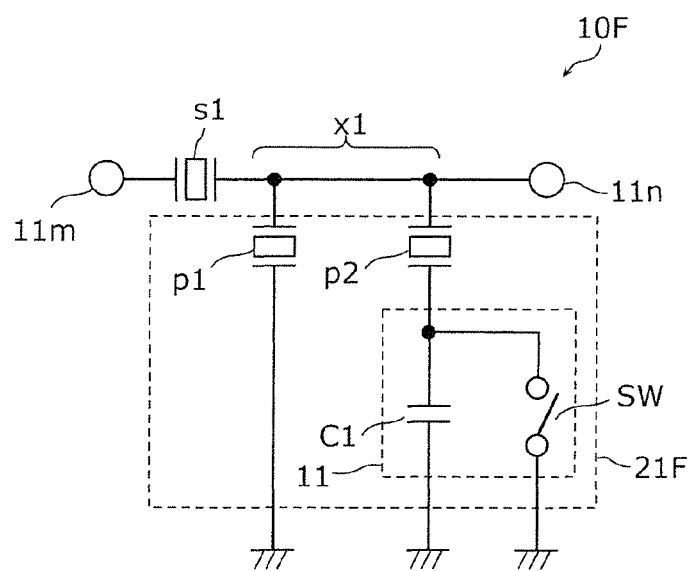
FIG. 14A is a circuit configuration diagram of a variable filter according to a third modification of the first embodiment.

FIG. 14A is a circuit configuration diagram of a variable filter 10F according to the third modification of the first embodiment.

The variable filter 10F illustrated in the diagram includes a parallel arm resonance circuit 21F in which the frequency variable circuit 11 is connected in series only to the parallel arm resonator p2 of the parallel arm resonator p1 and the parallel arm resonator p2 instead of the parallel arm resonance circuit 21E included in the variable filter 10F illustrated in FIG. 13A.

In other words, in the present modification, the parallel arm resonator p1 having the lower resonant frequency and anti-resonant frequency than those of the parallel arm resonator p2 (second acoustic wave resonator) is connected in parallel to the parallel arm resonator p2 and corresponds to the third acoustic wave resonator having the resonant frequency and the anti-resonant frequency different from those of the parallel arm resonator p2.

Figure 14B:
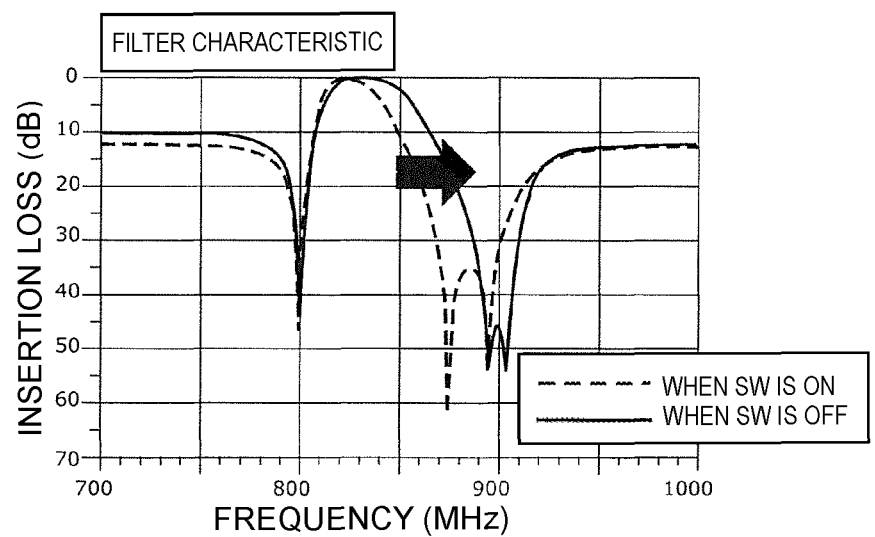
FIG. 14B is a graph showing a bandpass characteristic of the variable filter according to the third modification of the first embodiment.

FIG. 14B is a graph showing a bandpass characteristic of the variable filter 10F according to the third modification of the first embodiment. Specifically, the graph is a graph showing a comparison of the bandpass characteristics when the switch SW is on/off.

In the variable filter 10F, in the same manner as the variable filter 10E, the anti-resonant frequency on the low-band side of two anti-resonant frequencies of the parallel arm resonance circuit 21F and the resonant frequency of the serial arm resonator s1 are brought close to each other to form the pass band.

At this time, in the present modification, to the parallel arm resonator p2, only when the switch SW is off, the capacitance element C1 is added. Therefore, the resonant frequency on the high-band side of the two resonant frequencies of the parallel arm resonance circuit 21F shifts to the higher-band side than the resonant frequency of the parallel arm resonator p2 alone, when the switch SW is off. Additionally, the anti-resonant frequency of the parallel arm resonance circuit 21F on the low-band side shifts to the higher-band side than that when the switch SW is on, when the switch SW is off. Here, the attenuation pole of the pass band on the high-band side of the variable filter 10F is defined by the anti-resonant frequency of the parallel arm resonance circuit 21F on the high-band side. Additionally, the steepness of the attenuation slope of the pass band on the high-band side is defined by a difference frequency between the resonant frequency on the high-band side and the anti-resonant frequency on the low-band side of the parallel arm resonance circuit 21F. Therefore, as shown in the graph, in the variable filter 10F, by switching the switch SW from on to off, while shifting the attenuation pole of the pass band on the high-band side to the higher-band side, without necessarily dropping the shoulder of the pass band on the low-band side, the pass band can be shifted to the higher-band side.

In the above-described variable filter 10F, the film thickness of the plurality of electrode fingers configuring the IDT electrode of the parallel arm resonator p2 is larger than the film thickness of the plurality of electrode fingers configuring the IDT electrode of the serial arm resonator s1. With this, the frequency interval between the fundamental mode resonance point and the higher-order mode resonance point of the parallel arm resonator p2 becomes larger than the frequency interval between the fundamental mode resonance point and the higher-order mode resonance point of the serial arm resonator s1. With this, since the higher-order mode anti-resonant frequency of the serial arm resonator s1 and the higher-order mode resonant frequency of the parallel arm resonator p2 can be dispersed, the attenuation characteristics of the higher-order mode generation frequency band (the attenuation band on the higher-frequency side than the pass band) can be improved.

[1.8.4 Fourth Modification of Variable Filter Circuit]

In the second modification of the first embodiment, the variable filter 10E includes the frequency variable circuit 11 connected in series only to the parallel arm resonator p1 of the parallel arm resonator p1 and the parallel arm resonator p2. Additionally, in the third modification of the first embodiment, the variable filter 10F includes the frequency variable circuit 11 connected in series only to the parallel arm resonator p2 of the parallel arm resonator p1 and the parallel arm resonator p2. However, the filter may include both the frequency variable circuits 11 as described above.

Figure 15A:
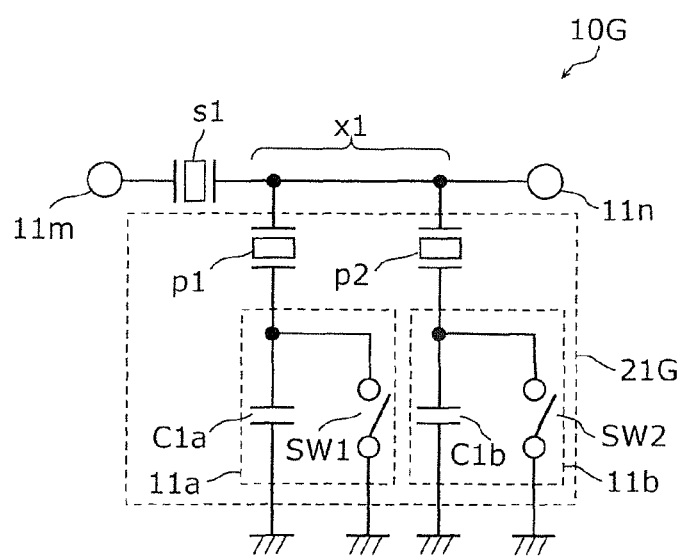
FIG. 15A is a circuit configuration diagram of a variable filter according to a fourth modification of the first embodiment.

FIG. 15A is a circuit configuration diagram of a variable filter 10G according to the fourth modification of the first embodiment.

The variable filter 10G illustrated in the diagram includes both a frequency variable circuit 11a that corresponds to the frequency variable circuit 11 included in the filter 10E illustrated in FIG. 13A and a frequency variable circuit 11b that corresponds to the frequency variable circuit 11 included in the variable filter 10F illustrated in FIG. 14A. In other words, a parallel arm resonance circuit 21G in the present modification includes the frequency variable circuit 11a connected in series only to one of the parallel arm resonators p1 and p2 (second acoustic wave resonator and third acoustic wave resonator), and the frequency variable circuit 11b connected in series only to the other of the parallel arm resonators p1 and p2 (second acoustic wave resonator and third acoustic wave resonator).

Figure 15B:
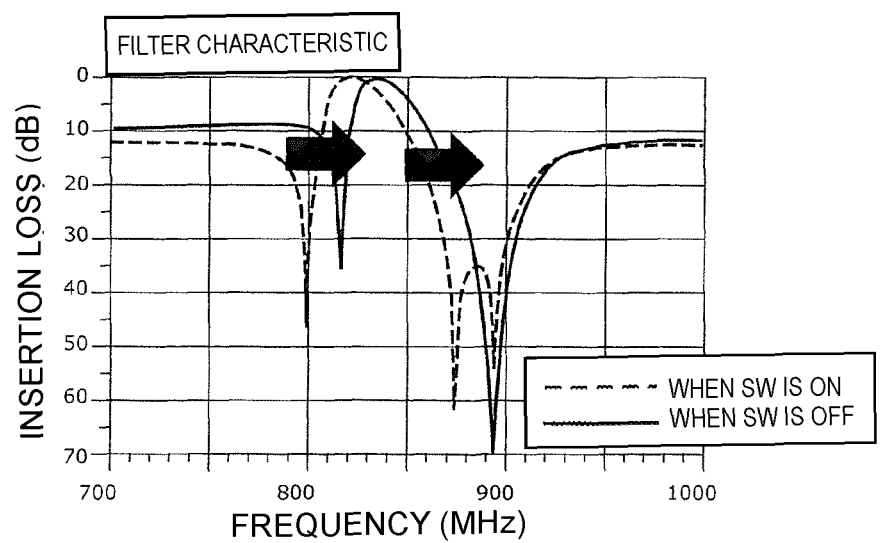
FIG. 15B is a graph showing a bandpass characteristic of the variable filter according to the fourth modification of the first embodiment.

FIG. 15B is a graph showing a bandpass characteristic of the variable filter 10G according to the fourth modification of the first embodiment. Specifically, the graph is a graph showing a comparison of the bandpass characteristics when the switches SW1 and SW2 are both on/both off.

In the present modification, to the parallel arm resonator p1, only when the switch SW1 is off, a capacitance element C1a is added. Additionally, to the parallel arm resonator p2, only when the switch SW2 is off, a capacitance element C1b is added. Accordingly, the resonant frequency on the low-band side of the two resonant frequencies of the parallel arm resonance circuit 21G shifts to the higher-band side than the resonant frequency of the parallel arm resonator p1 alone, when the switch SW1 is off. Additionally, the resonant frequency on the high-band side of the two resonant frequencies of the parallel arm resonance circuit 21G shifts to the higher-band side than the resonant frequency of the parallel arm resonator p2 alone, when the switch SW2 is off. Additionally, the anti-resonant frequency of the parallel arm resonance circuit 21G on the low-band side shifts to the higher-band side than that when both the switches SW1 and SW2 are on, when at least one of the switches SW1 and SW2 is off.

Therefore, as shown in the graph, in the variable filter 10G, by switching both the switches SW1 and SW2 from on to off, while shifting the attenuation poles of the pass band on the high-band side and of the pass band on the low-band side to the higher-band side, without necessarily dropping the shoulders of the pass band on the high-band side and of the pass band on the low-band side, the pass band can be shifted to the higher-band side. As a result, the variable filter 10G can shift a center frequency while maintaining the band width, for example.

Note that from a viewpoint of the filter bandpass characteristic, the frequency variable circuits 11a and 11b can include the capacitance elements C1a and C1b, but in consideration of the bandpass characteristic, a size, and the like required for the variable filter 10G, one of the frequency variable circuits 11a and 11b may have, for example, a capacitance configured by being laminated on the substrate 102 or a variable capacitor such as a varicap and a DTC (Digital Tunable Capacitor) instead of the comb-tooth capacitance.

Furthermore, the variable filter 10G need not turn both the switches SW1 and SW2 on/off and may individually turn these switches on/off. However, when the switches SW1 and SW2 both are turned on/off, the number of control lines for controlling the switches SW1 and SW2 can be reduced, so that the configuration of the variable filter 10G can be simplified.

On the other hand, when these switches are individually turned on/off, it is possible to increase variation on the pass band which can be switched by the variable filter 10G.

Specifically, in accordance with the on or off state of the switch SW2 connected in series to the parallel arm resonator p2, a high-band end of the pass band can be varied. Additionally, in accordance with the on or off state of the switch SW1 connected in series to the parallel arm resonator p1, a low-band end of the pass band can be varied.

Accordingly, by turning both the switches SW1 and SW2 on or off, both the low-band end and the high-band end of the pass band can be shifted to the lower-band side or the higher-band side. In other words, it is possible to shift the center frequency of the pass band to the lower-band side or the higher-band side. Furthermore, by switching one of the switches SW1 and SW2 from on to off and switching the other from off to on, it is possible to shift both the low-band end and the high-band end of the pass band so as to widen or narrow the frequency difference therebetween. In other words, it is possible to vary the pass band width while maintaining the center frequency of the pass band at a substantially constant frequency. Additionally, in a state in which one of the switches SW1 and SW2 is on or off, by turning the other on or off, it is possible to shift, in a state in which one of the low-band end and the high-band end of the pass band is fixed, the other to the lower-band side or the higher-band side. In other words, it is possible to vary the low-band end or the high-band end of the pass band.

As described above, the variable filter 10G includes the frequency variable circuit 11a which is connected in series only to the parallel arm resonator p1 of the parallel arm resonator p1 and the parallel arm resonator p2 and the frequency variable circuit 11b which is connected in series only to the parallel arm resonator p2 of the parallel arm resonator p1 and the parallel arm resonator p2, which makes it possible to enhance the degree of freedom for varying the pass band.

In the above-described variable filter 10G, the film thickness of the plurality of electrode fingers configuring the IDT electrode of each of the parallel arm resonators p1 and p2 is larger than the film thickness of the plurality of electrode fingers configuring the IDT electrode of the serial arm resonator s1. With this, the frequency interval between the fundamental mode resonance point and the higher-order mode resonance point of each of the parallel arm resonators p1 and p2 becomes larger than the frequency interval between the fundamental mode resonance point and the higher-order mode resonance point of the serial arm resonator s1. With this, since the higher-order mode anti-resonant frequency of the serial arm resonator s1 and the higher-order mode resonant frequency of each of the parallel arm resonators p1 and p2 can be dispersed, the attenuation characteristics of the higher-order mode generation frequency band (the attenuation band on the higher-frequency side than the pass band) can be improved.

[1.8.5 Fifth Modification of Variable Filter Circuit]

In the second modification of the first embodiment, the frequency variable circuit 11 is connected in series only to the parallel arm resonator p1 of the parallel arm resonator p1 and the parallel arm resonator p2. Furthermore, in the third modification of the first embodiment, the frequency variable circuit 11 is connected in series only to the parallel arm resonator p2 of the parallel arm resonator p1 and the parallel arm resonator p2. However, the frequency variable circuit 11 may be connected in series to a circuit in which the parallel arm resonator p1 and the parallel arm resonator p2 are connected in parallel to each other.

Figure 16A:
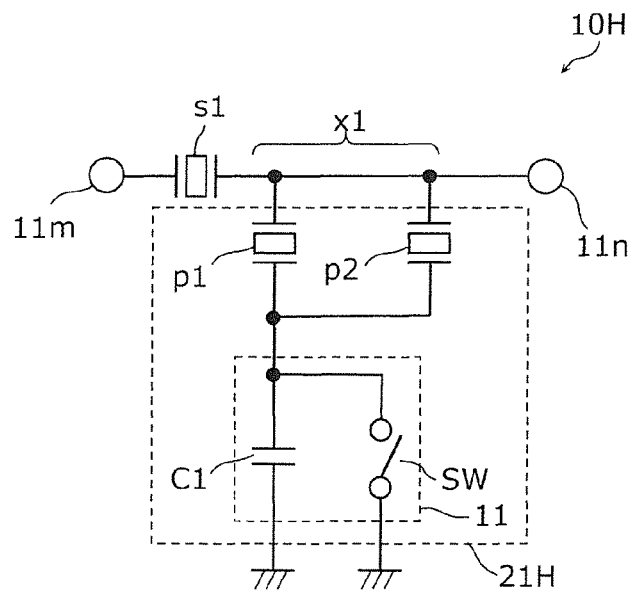
FIG. 16A is a circuit configuration diagram of a variable filter according to a fifth modification of the first embodiment.

FIG. 16A is a circuit configuration diagram of a variable filter 10H according to the fifth modification of the first embodiment.

The variable filter 10H illustrated in the diagram includes a parallel arm resonance circuit 21H having the frequency variable circuit 11 which is connected in series to the circuit in which the parallel arm resonator p1 and the parallel arm resonator p2 are connected in parallel to each other.

Figure 16B:
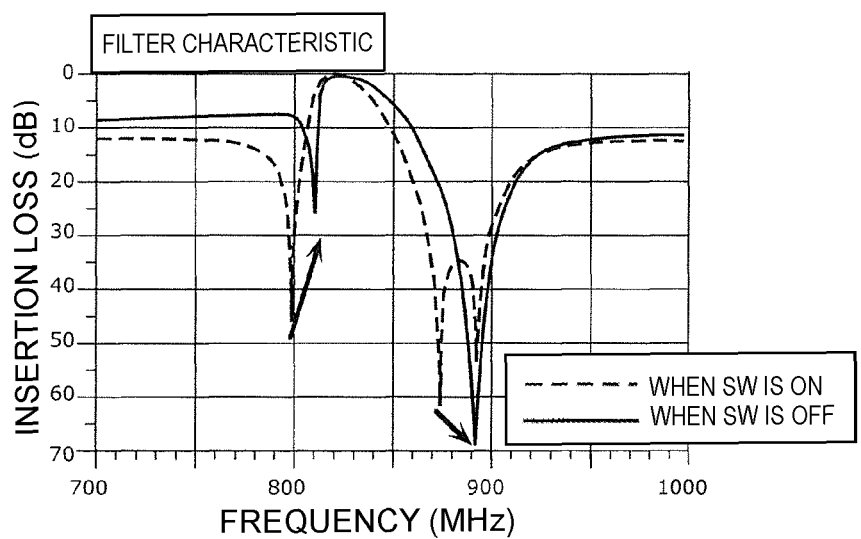
FIG. 16B is a graph showing a bandpass characteristic of the variable filter according to the fifth modification of the first embodiment.

FIG. 16B is a graph showing a bandpass characteristic of the variable filter 10H according to the fifth modification of the first embodiment. Specifically, the graph is a graph showing a comparison of the bandpass characteristics when the switch SW is on/off.

In the variable filter 10H, in the same manner as the variable filter 10E, the anti-resonant frequency on the low-band side of two anti-resonant frequencies of the parallel arm resonance circuit 21H and the resonant frequency of the serial arm resonance circuit (in the present modification, the serial arm resonator s1) are brought close to each other to form the pass band.

At this time, in the present modification, to each of the parallel arm resonators p1 and p2, only when the switch SW is off, the capacitance element C1 is added. Therefore, the resonant frequency on the low-band side of the two resonant frequencies of the parallel arm resonance circuit 21H shifts to the higher-band side than the resonant frequency of the parallel arm resonator p1 alone, when the switch SW is off. Additionally, the resonant frequency on the high-band side of the two resonant frequencies of the parallel arm resonance circuit 21H shifts to the higher-band side than the resonant frequency of the parallel arm resonator p2 alone, when the switch SW is off. However, the anti-resonant frequency of the parallel arm resonance circuit 21H on the low-band side is not shifted when the switch SW is off by the frequency variable circuit 11 being connected in series to the circuit in which the parallel arm resonator p1 and the parallel arm resonator p2 are connected in parallel to each other. Therefore, as shown in the graph, the variable filter 10H can shift the attenuation poles of the pass band on both sides to the higher-band side by switching the switch SW from on to off.

In the above-described variable filter 10H, the film thickness of the plurality of electrode fingers configuring the IDT electrode of each of the parallel arm resonators p1 and p2 is larger than the film thickness of the plurality of electrode fingers configuring the IDT electrode of the serial arm resonator s1. With this, the frequency interval between the fundamental mode resonance point and the higher-order mode resonance point of each of the parallel arm resonators p1 and p2 becomes larger than the frequency interval between the fundamental mode resonance point and the higher-order mode resonance point of the serial arm resonator s1. With this, since the higher-order mode anti-resonant frequency of the serial arm resonator s1 and the higher-order mode resonant frequency of each of the parallel arm resonators p1 and p2 can be dispersed, the attenuation characteristics of the higher-order mode generation frequency band (the attenuation band on the higher-frequency side than the pass band) can be improved.

Second Embodiment

The variable filters (acoustic wave devices) described in the first embodiment can be applied to a radio frequency front-end circuit and the like.

Accordingly, in the present embodiment, such a radio frequency front-end circuit will be described.

Figure 17:
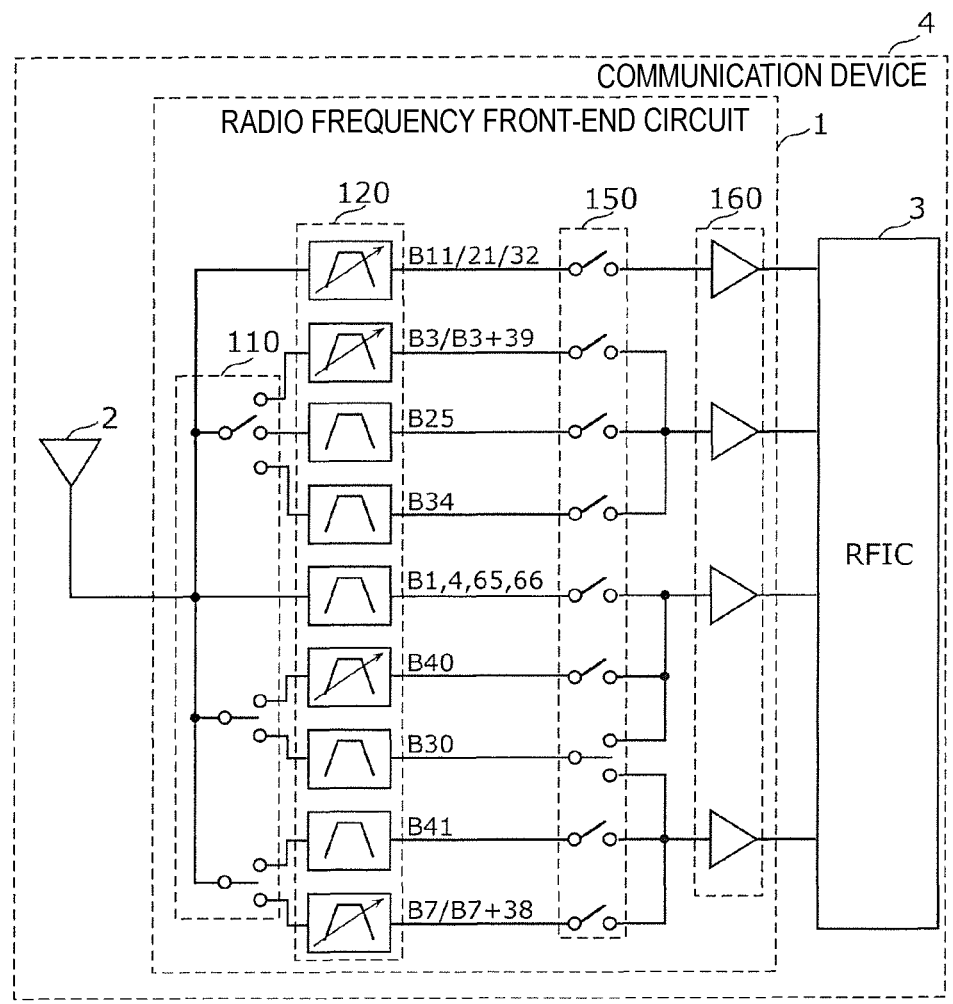
FIG. 17 is a configuration diagram of a radio frequency front-end circuit and a peripheral circuit thereof according to a second embodiment.

FIG. 17 is a configuration diagram of a radio frequency front-end circuit 1 and a peripheral circuit thereof according to a second embodiment. The diagram illustrates the radio frequency front-end circuit 1, an antenna element 2, and an RF signal processing circuit (RFIC) 3. The radio frequency front-end circuit 1, the RFIC 3, and the antenna element 2 configure a communication device 4. The antenna element 2, the radio frequency front-end circuit 1, and the RFIC 3 are arranged, for example, at the front end portion of a multi-mode/multi-band capable cellular phone.

The antenna element 2 is a multi-band capable antenna that transmits and receives a radio frequency signal and that is based on a communication standard such as LTE, for example. Note that the antenna element 2 may not handle all bands of the communication device 4, for example, and may handle only a band of a low-frequency band group or a high-frequency band group. Furthermore, the antenna element 2 may not be built in the communication device 4.

The RFIC 3 is an RF signal processing circuit that processes the radio frequency signal transmitted and received by the antenna element 2. Specifically, the RFIC 3 performs signal processing, such as down conversion, on a radio frequency signal (here, a radio frequency reception signal) input from the antenna element 2 through a reception-side signal path of the radio frequency front-end circuit 1 and outputs a reception signal generated by the signal processing to a baseband signal processing circuit (not illustrated). Furthermore, the RFIC 3 performs signal processing, such as up conversion, on a transmission signal input from the baseband signal processing circuit and outputs a radio frequency signal generated by the signal processing (here, a radio frequency transmission signal) to a transmission-side signal path of the radio frequency front-end circuit 1 (not illustrated).

The radio frequency front-end circuit 1 is a circuit for transmitting the radio frequency signal between the antenna element 2 and the RFIC 3. Specifically, the radio frequency front-end circuit 1 transmits the radio frequency signal output from the RFIC 3 (here, the radio frequency transmission signal) to the antenna element 2 through the transmission-side signal path (not illustrated). Furthermore, the radio frequency front-end circuit 1 transmits the radio frequency signal received by the antenna element 2 (here, the radio frequency reception signal) to the RFIC 3 through the reception-side signal path. In the present embodiment, a configuration in which the variable filter according to the first embodiment is provided in the reception-side signal path of the radio frequency front-end circuit 1 is described, but the variable filter may be provided in the transmission-side signal path of the radio frequency front-end circuit 1.

The radio frequency front-end circuit 1 includes a switch group 110 configured of a plurality of switches, a filter group 120 configured of a plurality of filters, a switch group 150, and a reception amplifier circuit group 160, in this order from the antenna element 2 side.

The switch group 110 is configured of one or more switches (in the present embodiment, a plurality of switches) which connect the antenna element 2 and a signal path handling a predetermined band in accordance with the control signal from the control unit (not illustrated). Note that the number of signal paths connected to the antenna element 2 is not limited to one, and a plurality of paths may be connected. In other words, the radio frequency front-end circuit 1 may handle carrier aggregation.

The filter group 120 is configured of one or more filters, and in the present embodiment, is configured of the following plurality of filters, for example. Specifically, the bands and the filters are as follows: (i) a tunable filter capable of handling Bands 11, 21, and 32; (ii) a tunable filter capable of handling Band 3 and CA (carrier aggregation) of Bands 3 and 9; (iii) a filter handling Band 25; (iv) a filter handling Band 34; (v) a filter handling Bands 1, 4, 65, and 66; (vi) a tunable filter handling Band 40; (vii) a filter handling Band 30; (viii) a filter handling Band 41; and (ix) a tunable filter capable of handling Band 7 and CA of the Bands 7 and 38.

The switch group 150 is configured of one or more switches (in the present embodiment, a plurality of switches) that connect a signal path which handles a predetermined band and a reception amplifier circuit, which handles the predetermined band, of the reception amplifier circuit group 160 in accordance with the control signal from the control unit (not illustrated). Note that the number of signal paths connected to the antenna element 2 is not limited to one, and a plurality of paths may be connected. In other words, the radio frequency front-end circuit 1 may handle carrier aggregation. With this configuration, the radio frequency signal (here, the radio frequency reception signal) input from the antenna element 2 is amplified by the predetermined reception amplifier circuit of the reception amplifier circuit group 160 through the predetermined filter of the filter group 120 and is output to the RFIC 3. Note that the RFIC handling the low band and the RFIC handling the high band may be individually provided.

The reception amplifier circuit group 160 is configured of one or more low noise amplifiers (in the present embodiment, a plurality of low noise amplifiers) that amplify the radio frequency reception signal input from the switch group 150.

The radio frequency front-end circuit 1 configured as described above includes any one of the variable filters 10, 10D to 10H, and 10Z according to application examples of the first embodiment as at least one tunable filter. With this, since the attenuation characteristics on the higher-frequency side than the pass band can be improved and the number of filters can be reduced as compared with the case where the filter is provided for each band, the miniaturization can be achieved.

Other Embodiments

Although the acoustic wave device and the radio frequency front-end circuit according to the embodiments of the present disclosure have been described using the first and second embodiments, the present disclosure is not limited to the above embodiments. The present disclosure also encompasses other embodiments that are implemented by combining desired constituent elements in the above-described embodiments, modifications obtained by adding various changes to the above-described embodiments, which are conceived by those skilled in the art, without departing from the gist of the present disclosure, and various apparatuses incorporating the acoustic wave device and the radio frequency front-end circuit according to the present disclosure.

For example, the communication device 4 including the radio frequency front-end circuit 1 and the RFIC 3 (RF signal processing circuit) described above is also included in the present disclosure. According to the communication device 4 as described above, it is possible to improve the attenuation characteristics on the higher-frequency side than the pass band.

Additionally, a multiplexer, such as a duplexer, including the variable filter as described above is also included in the present disclosure. In other words, in a multiplexer in which a plurality of filters is commonly connected, at least one variable filter may be any one of the variable filters described above.

In addition, among the acoustic wave resonators configuring the variable filter, at least one of one or more acoustic wave resonators, excluding the acoustic wave resonator (second acoustic wave resonator) connected to the comb-tooth capacitance without interposing another acoustic wave resonator, may be configured of an acoustic wave resonator using bulk waves or boundary acoustic waves.

Furthermore, for example, in the radio frequency front-end circuit or the communication device, an inductor or a capacitor may be connected between constituent elements. Note that the inductor may include a wiring inductor by a wiring connecting between the constituent elements.

INDUSTRIAL APPLICABILITY

The present disclosure is widely applicable to communication apparatuses, such as a cellular phone, as a variable filter, a multiplexer, a front-end circuit, and a communication device with excellent attenuation characteristics on a high-frequency side.

REFERENCE SIGNS LIST

1 RADIO FREQUENCY FRONT-END CIRCUIT
2 ANTENNA ELEMENT
3 RFIC (RF SIGNAL PROCESSING CIRCUIT)
4 COMMUNICATION DEVICE
10, 10D, 10E, 10F, 10G, 10H, 10Z VARIABLE FILTER (ACOUSTIC WAVE DEVICE)
11, 11a, 11b, 11D, 12, 13 FREQUENCY VARIABLE CIRCUIT
11m, 11n INPUT AND OUTPUT TERMINAL 21, 21D, 21E, 21F, 21G, 21H, 22, 23 PARALLEL ARM RESONANCE CIRCUIT
101 ELECTRODE FILM
102 SUBSTRATE
103, 103b, 104 PROTECTIVE LAYER
103a ADJUSTMENT FILM
110, 150 SWITCH GROUP
111, 113, 115, 121, 123, 125 IDT ELECTRODE
112, 114, 116, 122, 124, 126 REFLECTOR
120 FILTER GROUP
131, 132, 133 COMB-TOOTH CAPACITANCE ELECTRODE
160 RECEPTION AMPLIFIER CIRCUIT GROUP
211, 212, 213, 214, 215 METAL FILM
C1, C1a, C1b, C2, C3 CAPACITANCE ELEMENT
L INDUCTOR
p1, p2, p3 PARALLEL ARM RESONATOR
s1, s2, s3 SERIAL ARM RESONATOR
SW, SW1, SW2, SW3 SWITCH (SWITCH ELEMENT)

The invention claimed is:

1. A frequency variable type acoustic wave device comprising:
   a first input/output terminal and a second input/output terminal, each of the first and second input/output terminals for input and output of a radio frequency signal;
   a serial arm resonance circuit provided in a first path, the first path connecting the first input/output terminal and the second input/output terminal, and the serial arm resonance circuit comprising a first acoustic wave resonator; and
   a parallel arm resonance circuit provided in a second path, the second path connecting a node in the first path and ground, and the parallel arm resonance circuit forming a pass band of the acoustic wave device with the serial arm resonance circuit,
   wherein the parallel arm resonance circuit comprises:
      a second acoustic wave resonator, and
      a frequency variable circuit connected to the second acoustic wave resonator and configured to vary the pass band,
   wherein the frequency variable circuit comprises a capacitance element connected to the second acoustic wave resonator,
   wherein each of the first acoustic wave resonator and the second acoustic wave resonator includes an interdigital transducer (IDT) electrode comprising a plurality of electrode fingers formed on a substrate, at least part of the substrate having a piezoelectricity,
   wherein a film thickness of the plurality of electrode fingers of the second acoustic wave resonator is greater than a film thickness of the plurality of electrode fingers of the first acoustic wave resonator, and
   wherein a higher-order mode resonant frequency of the second acoustic wave resonator is higher than a higher-order mode resonant frequency of the first acoustic wave resonator.

2. The acoustic wave device according to claim 1, wherein the capacitance element is provided by a comb-tooth capacitance electrode having a plurality of electrode fingers on a substrate.

3. The acoustic wave device according to claim 1, wherein the frequency variable circuit further comprises a switch connected in parallel with the capacitance element between the second acoustic wave resonator and ground.

4. The acoustic wave device according to claim 3, wherein:
   the frequency variable circuit further comprises an inductor connected in series with the switch, and
   the switch and the inductor are together connected in parallel with the capacitance element.

5. A radio frequency front-end circuit comprising:
   the acoustic wave device according to claim 1; and
   an amplifier circuit connected to the acoustic wave device.

6. A frequency variable type acoustic wave device comprising:
   a first input/output terminal and a second input/output terminal, each of the first and second input/output terminals for input and output of a radio frequency signal;
   a serial arm resonance circuit provided in a first path, the first path connecting the first input/output terminal and the second input/output terminal, and the serial arm resonance circuit comprising a first acoustic wave resonator; and
   a parallel arm resonance circuit provided in a second path, the second path connecting a node in the first path and ground, and the parallel arm resonance circuit forming a pass band of the acoustic wave device with the serial arm resonance circuit,
   wherein the parallel arm resonance circuit comprises:
      a second acoustic wave resonator, and
      a frequency variable circuit connected to the second acoustic wave resonator and configured to vary the pass band,
   wherein the frequency variable circuit comprises a capacitance element connected to the second acoustic wave resonator,
   wherein each of the first acoustic wave resonator and the second acoustic wave resonator includes an interdigital transducer (IDT) electrode comprising a plurality of electrode fingers formed on a substrate, at least part of the substrate having a piezoelectricity,
   wherein a film thickness of the plurality of electrode fingers of the second acoustic wave resonator is greater than a film thickness of the plurality of electrode fingers of the first acoustic wave resonator,
   wherein the capacitance element is provided by a comb-tooth capacitance electrode having a plurality of electrode fingers on a substrate,
   wherein a pitch of the plurality of electrode fingers of the comb-tooth capacitance electrode is narrower than a pitch of the plurality of electrode fingers of each of the first acoustic wave resonator and the second acoustic wave resonator,
   wherein a film thickness of the plurality of electrode fingers of the comb-tooth capacitance electrode is equal to or less than the film thickness of the plurality of electrode fingers of the first acoustic wave resonator, and
   wherein a self-resonance point of the capacitance element is greater than a center frequency of the pass band of the acoustic wave device.

7. An frequency variable type acoustic wave device comprising:
   a first input/output terminal and a second input/output terminal, each of the first and second input/output terminals for input and output of a radio frequency signal;
   a serial arm resonance circuit provided in a first path, the first path connecting the first input/output terminal and the second input/output terminal, and the serial arm resonance circuit comprising a first acoustic wave resonator; and a parallel arm resonance circuit provided in a second path, the second path connecting a node in the first path and ground, and the parallel arm resonance circuit forming a pass band of the acoustic wave device with the serial arm resonance circuit, wherein the parallel arm resonance circuit comprises:
a second acoustic wave resonator, and
a frequency variable circuit connected to the second acoustic wave resonator and configured to vary the pass band, wherein the frequency variable circuit comprises a capacitance element connected to the second acoustic wave resonator, wherein each of the first acoustic wave resonator and the second acoustic wave resonator includes an interdigital transducer (IDT) electrode comprising a plurality of electrode fingers provided by a plurality of metal films laminated on a substrate, at least part of the substrate having a piezoelectricity, and wherein a film thickness of the metal film having the greatest density among the plurality of metal films of the second acoustic wave resonator is greater than a film thickness of the metal film having the greatest density among the plurality of metal films of the first acoustic wave resonator.

8. The acoustic wave device according to claim 7, wherein a film thickness of a metal film of the second acoustic wave resonator other than the metal film having the greatest density is equal to or less than a film thickness of a metal film of the first acoustic wave resonator other than the metal film having the greatest density.

9. The acoustic wave device according to claim 7, wherein the capacitance element is provided by a substrate and a comb-tooth capacitance electrode comprising a plurality of electrode fingers provided by a plurality of metal films laminated on the substrate.

10. The acoustic wave device according to claim 9, wherein:
a pitch of the plurality of electrode fingers of the comb-tooth capacitance electrode is narrower than a pitch of the plurality of electrode fingers of each of the first acoustic wave resonator and the second acoustic wave resonator,
a film thickness of the metal film having the greatest density among the plurality of metal films of the comb-tooth capacitance electrode is equal to or less than the film thickness of the metal film having the highest density among the plurality of metal films of the first acoustic wave resonator, and
a self-resonance point of the capacitance element is greater than a center frequency of the pass band of the acoustic wave device.

11. The acoustic wave device according to claim 9, wherein a film thickness of a metal film of the comb-tooth capacitance electrode other than the metal film having the greatest density is equal to or less than a film thickness of a metal film of the second acoustic wave resonator other than the metal film having the greatest density.

12. The acoustic wave device according to claim 9, wherein:
the parallel arm resonance circuit further comprises a third acoustic wave resonator, and
the frequency variable circuit is connected in series with each of the second acoustic wave resonator and the third acoustic wave resonator, the second acoustic wave resonator and the third acoustic wave resonator being connected in parallel with each other.

13. The acoustic wave device according to claim 9, wherein:
the parallel arm resonance circuit further comprises a third acoustic wave resonator,
the third acoustic wave resonator is connected in parallel with each of the second acoustic wave resonator and the frequency variable circuit, the second acoustic wave resonator and the frequency variable circuit being connected in series with each other between the node and ground, and
a resonant frequency of the third acoustic wave resonator is different from a resonant frequency of the second acoustic wave resonator, and an anti-resonant frequency of the third acoustic wave resonator is different from an anti-resonant frequency of the second acoustic wave resonator.

14. The acoustic wave device according to claim 13, wherein:
the resonant frequency of the third acoustic wave resonator is less than the resonant frequency of the second acoustic wave resonator,
the anti-resonant frequency of the third acoustic wave resonator is less than the anti-resonant frequency of the second acoustic wave resonator, and
the frequency variable circuit is connected in series with the second acoustic wave resonator, and is not connected in series with the third acoustic wave resonator.

15. The acoustic wave device according to claim 13, wherein:
the resonant frequency of the third acoustic wave resonator is greater than the resonant frequency of the second acoustic wave resonator,
the anti-resonant frequency of the third acoustic wave resonator is greater than the anti-resonant frequency of the second acoustic wave resonator, and
the frequency variable circuit is connected in series with the second acoustic wave resonator, and is not connected in series with the third acoustic wave resonator.

16. The acoustic wave device according to claim 13, wherein:
the frequency variable circuit is connected in series with only one of the second acoustic wave resonator and the third acoustic wave resonator, and
the parallel arm resonance circuit further comprises another frequency variable circuit connected between the node and ground and connected in series with only the other of the second acoustic wave resonator and the third acoustic wave resonator.

17. The acoustic wave device according to claim 7, wherein a higher-order mode resonant frequency of the second acoustic wave resonator is higher than a higher-order mode resonant frequency of the first acoustic wave resonator.

18. The acoustic wave device according to claim 7, wherein the frequency variable circuit further comprises a switch connected in parallel with the capacitance element between the second acoustic wave resonator and ground.

19. The acoustic wave device according to claim 18, wherein:
the frequency variable circuit further comprises an inductor connected in series with the switch, and
the switch and the inductor are together connected in parallel with the capacitance element.

* * * * *